United States Patent
Bulger

(10) Patent No.: US 10,559,741 B2
(45) Date of Patent: Feb. 11, 2020

(54) METHOD OF PROVIDING PROTECTIVE CAVITY AND INTEGRATED PASSIVE COMPONENTS IN WAFER LEVEL CHIP SCALE PACKAGE USING A CARRIER WAFER

(71) Applicant: SKYWORKS SOLUTIONS, INC., Woburn, MA (US)

(72) Inventor: Joseph Michael Bulger, Littleton, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 16/446,048

(22) Filed: Jun. 19, 2019

(65) Prior Publication Data

US 2019/0305750 A1 Oct. 3, 2019

Related U.S. Application Data

(62) Division of application No. 15/371,315, filed on Dec. 7, 2016, now Pat. No. 10,374,574.

(60) Provisional application No. 62/264,409, filed on Dec. 8, 2015.

(51) Int. Cl.
| | |
|---|---|
| *H01L 41/22* | (2013.01) |
| *H03H 9/10* | (2006.01) |
| *H03H 9/05* | (2006.01) |
| *H03H 3/08* | (2006.01) |

(52) U.S. Cl.
CPC .............. *H01L 41/22* (2013.01); *H03H 3/08* (2013.01); *H03H 9/0538* (2013.01); *H03H 9/0576* (2013.01); *H03H 9/1007* (2013.01); *H03H 9/1057* (2013.01); *H03H 9/1071* (2013.01)

(58) Field of Classification Search
CPC .. H03H 9/0576; H03H 9/1071; H03H 9/1057; H03H 9/1007; H03H 9/0538; H03H 3/08; H03H 9/0561; H03H 9/0571; H01L 2924/1461; H01L 41/22; H01L 24/28; H01L 24/27; H01L 24/04; H01L 24/03; H01L 23/485; H01L 23/315; H01L 23/12
USPC ......... 333/133, 187, 188, 193–196; 29/25.35
See application file for complete search history.

(56) References Cited

U.S. PATENT DOCUMENTS

| | | | |
|---|---|---|---|
| 9,166,141 B2 | 10/2015 | Vilkomerson et al. | |
| 2004/0207059 A1 | 10/2004 | Hong | |
| 2009/0001849 A1 | 1/2009 | Tsuda | |
| 2010/0301708 A1 | 12/2010 | Tsuda | |
| 2011/0012478 A1 | 1/2011 | Najafi et al. | |
| 2011/0012695 A1 | 1/2011 | Yamaji et al. | |
| 2012/0280768 A1* | 11/2012 | Nakayama | H03H 9/0057 333/193 |

(Continued)

OTHER PUBLICATIONS

International Search Report and Written Opinion from corresponding International Application No. PCT/US2016/065280 dated Mar. 15, 2017.

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

A wafer-level chip-scale package includes a body, a conductive via passing through the body, a contact bump formed at a lower portion of the body and in electrical connection with a lower end of the conductive via, a piezoelectric substrate directly bonded to an upper end of the conductive via, and a cavity defined between a portion of the body and the piezoelectric substrate.

20 Claims, 32 Drawing Sheets

(56) References Cited

U.S. PATENT DOCUMENTS

2014/0118084 A1 5/2014 Takemura
2014/0339957 A1 11/2014 Tajima et al.

* cited by examiner

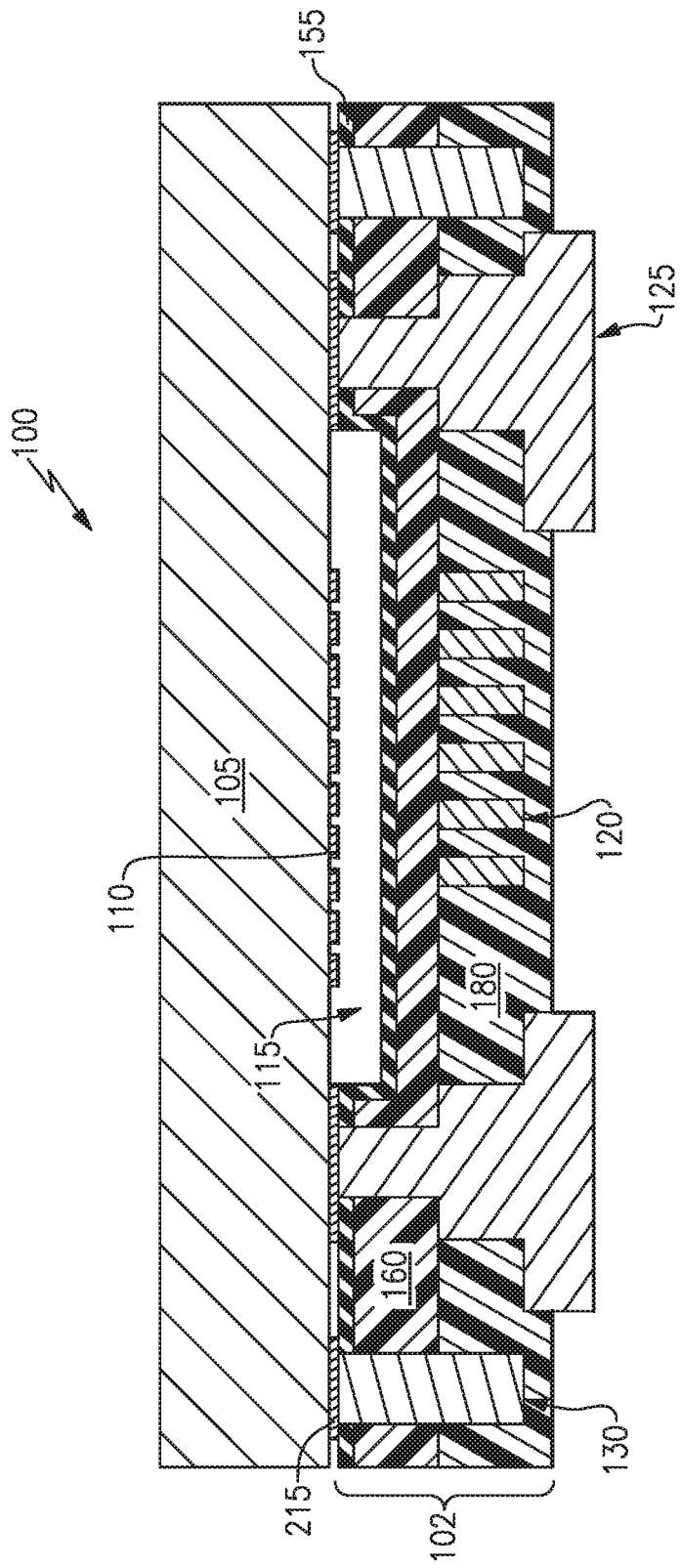

METHOD OF PROVIDING PROTECTIVE CAVITY AND INTEGRATED PASSIVE COMPONENTS IN WAFER LEVEL CHIP SCALE PACKAGE USING A CARRIER WAFER

CROSS REFERENCE TO RELATED APPLICATIONS

This application claims priority under 35 U.S.C. § 121 as a division of U.S. patent application Ser. No. 15/371,315, titled "METHOD OF PROVIDING PROTECTIVE CAVITY AND INTEGRATED PASSIVE COMPONENTS IN WAFER LEVEL CHIP SCALE PACKAGE USING A CARRIER WAFER," filed on Dec. 7, 2016, now U.S. Pat. No. 10,374,574 B2 issued on Aug. 6, 2019,which claims the benefit of priority under 35 U.S.C. § 119(e) to U.S. Provisional Patent Application No. 62/264,409, titled "METHOD OF PROVIDING PROTECTIVE CAVITY AND INTEGRATED PASSIVE COMPONENTS IN WAFER LEVEL CHIP SCALE PACKAGE USING A CARRIER WAFER," filed on Dec. 8, 2015, each of which being incorporated herein by reference in its entirety for all purposes.

BACKGROUND

1. Field of Invention

The present invention relates generally to chip-scale packages for semiconductor devices, and methods for fabricating the same. More particularly, at least some embodiments are directed to chip-scale packages for micro-electro-mechanical system (MEMS) devices.

2. Discussion of Related Art

MEMS devices may be isolated from the environment by being disposed within a cavity in a package for the MEMS devices. Some forms of MEMS devices, for example, surface acoustic wave (SAW) filters or bulk acoustic wave (BAW) filters are formed on a piezoelectric substrate, for example, lithium tantalate ($LiTaO_3$). Piezoelectric substrates are typically fragile, which makes handling of the substrates during fabrication of the MEMS devices challenging.

SUMMARY OF INVENTION

According to one aspect of the present invention there is provided a wafer-level chip-scale package. The package comprises a body, a conductive via passing through the body, a contact bump formed at a lower portion of the body and in electrical connection with a lower end of the conductive via, a piezoelectric substrate directly bonded to an upper end of the conductive via, and a cavity defined between a portion of the body and the piezoelectric substrate. The body may be a polymeric body. The piezoelectric substrate may be directly bonded to the upper end of the conductive via with one of a transient liquid phase bond and a solder bond.

In accordance with another aspect, there is provided a wafer-level chip-scale package. The package comprises a polymeric body having a conductive via passing through the polymeric body and a contact bump formed at a lower portion of the polymeric body and in electrical connection with a lower end of the conductive via. A piezoelectric substrate is directly bonded to an upper end of the conductive via with one of a transient liquid phase bond and a solder bond. The wafer-level chip-scale package has a cavity defined between a portion of the polymeric body and the piezoelectric substrate.

In some embodiments, the package further includes a seal ring disposed in the body and having an upper end directly bonded to the piezoelectric substrate. The seal ring may include metal. The package may further include a metal standoff disposed between one of an upper end of the conductive via and the piezoelectric substrate and an upper end of the seal ring and the piezoelectric substrate. The seal ring may surround the cavity and hermetically seal the cavity.

In some embodiments, the package further includes a dielectric layer disposed on walls of the cavity and hermetically sealing the cavity.

In some embodiments, the package further includes interdigital (IDT) electrodes of an acoustic wave filter disposed on the piezoelectric substrate within the cavity.

In some embodiments, the package further includes a passive device disposed within the body of the package. The passive device may include an inductor.

In some embodiments, the body includes polyimide. The body may include two layers of polymer and a dielectric layer disposed between the two layers of polymer.

In some embodiments, the package further includes a first polymer standoff disposed between the body and the piezoelectric substrate. The first polymer standoff may define a first lateral end of the cavity and a second polymer standoff disposed between the body and the piezoelectric substrate may define a second lateral end of the cavity.

In some embodiments, the package further includes a metal roof disposed within the body below the cavity.

In some embodiments, the package further includes a metal roof disposed on an upper surface of the body and defining a lower surface of the cavity. Metal standoffs may be disposed between the metal roof and the piezoelectric substrate.

In some embodiments, the package further includes a metal roof encapsulated in a dielectric and disposed on an upper surface of the body below the cavity. Metal standoffs may be disposed between the dielectric and the piezoelectric substrate.

In some embodiments, the wafer-level chip-scale package is included in an electronic device module. The electronic device module may be a radio frequency (RF) device module. The wafer-level chip-scale package may be included in a duplexer. The wafer-level chip-scale package may be included in an electronic device. The electronic device may be an RF device.

According to another aspect of the present invention there is provided a method of forming wafer-level chip-scale packages. The wafer-level chip-scale packages may include devices disposed on a piezoelectric substrate. The method comprises forming bodies of the packages on a sacrificial semiconductor wafer, forming conductive vias passing through the bodies, forming seal rings including portions disposed in the bodies, removing the sacrificial semiconductor wafer from the bodies, and bonding a lower surface of the piezoelectric substrate directly to the conductive vias and to the seal rings such that the devices are positioned within the cavities.

In some embodiments, the method further comprises forming metal layers in upper portions of the bodies and forming cavities in the bodies by removing the metal layers.

In some embodiments, forming the device includes forming interdigital electrodes on a lower surface of a piezoelectric substrate.

In some embodiments, the method further comprises dicing the piezoelectric substrate and bodies to form a plurality of the wafer-level chip-scale packages.

In some embodiments, the method further comprises forming passive devices within the bodies.

In some embodiments, the method further comprises mounting the wafer-level chip-scale packages in electronic device modules. In some embodiments, the method further comprises mounting the electronic device modules in electronic devices.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings:

FIG. 1 is a cross-sectional side view of an example of a wafer-level chip-scale package;

DETAILED DESCRIPTION

Figure 2A:
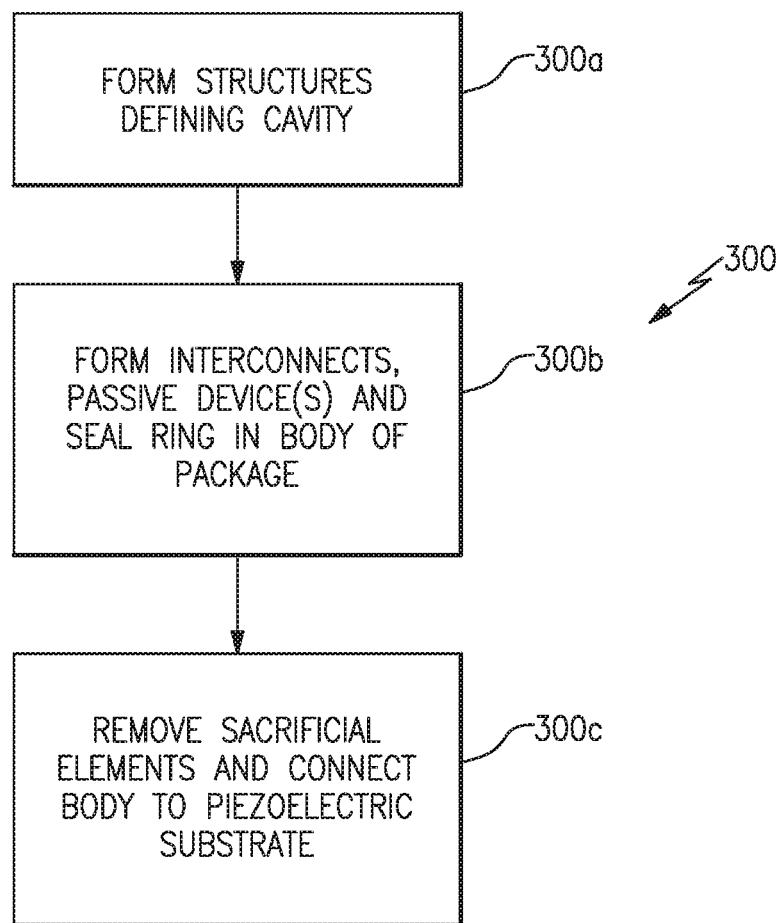
FIG. 2A is a flow chart illustrating an embodiment of a method of forming the package of FIG. 1.

An example of a chip-scale package including a packaged SAW filter is illustrated in FIG. 1, indicated generally at 100. The SAW filter includes a piezoelectric substrate 105, for example, a lithium tantalate substrate or a sapphire substrate. Interdigital transducer (IDT) electrodes 110 of the SAW filter are disposed on the substrate 105 within a cavity 115 defined in the package 100. In some embodiments, one or more passive devices 120, for example, inductors or capacitors are disposed within material forming the body 102 of the package 100. Electrical contact bumps 125 provide electrical connection to the SAW filter IDT electrodes 110 and/or the one or more passive devices 120. The package 100 may be mounted on a printed circuit board or other substrate and the SAW filter may electrically communicate with other devices on the circuit board or other substrate through the contact bumps 125. A ring seal 130 is bonded to the substrate 105 around the IDT electrodes 110 and hermetically seals the cavity 115. In some embodiments, the ring seal 130 is about 10 microns to about 100 microns wide. In some embodiments the ring seal 130 fully circumscribes the cavity 115 and/or contact bumps 125. The ring seal 130 may be, for example, circular, square, rectangular, or any other desired shape suitable to hermetically seal the cavity 115. It should be appreciated that although a SAW filter is illustrated in FIG. 1, other forms of elastic wave devices or other types of MEMS devices may be utilized in the illustrated chip-scale package.

Figure 2B:
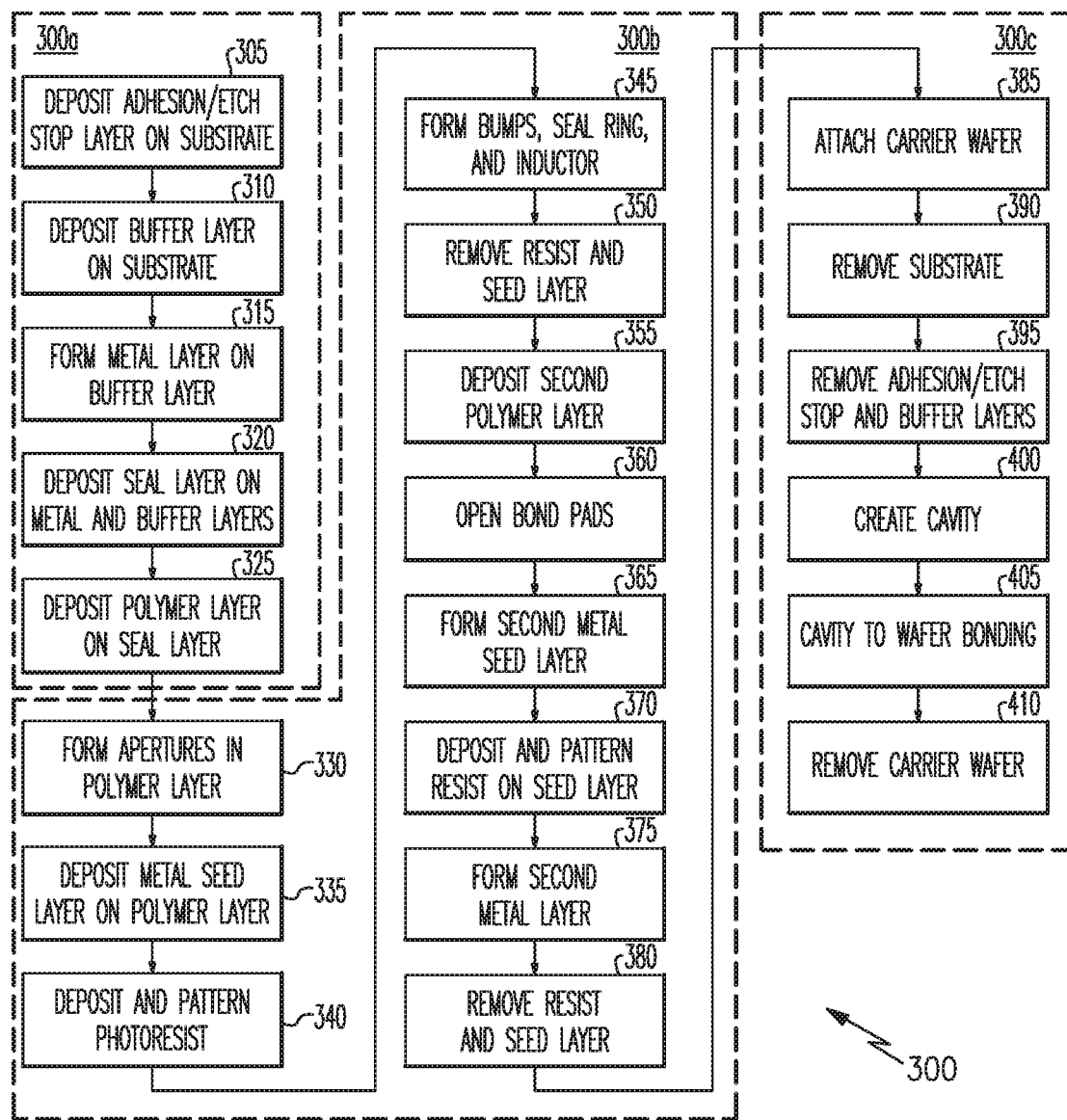
FIG. 2B is a flow chart illustrating the method of FIG. 2A in additional detail.

An embodiment of a process of forming the packaged SAW filter of FIG. 1 is illustrated in the flowchart of FIG. 2A, generally indicated at 300. The process 300 may be broken into a sub-process 300a of forming the structures which will define the cavity 115, a sub-process 300b of forming interconnects, passive device(s), and a seal ring in a polymeric body of the package 100, and a sub-process 300c of removing sacrificial elements used in forming the package and finalizing connection of the polymeric body to a piezoelectric substrate including the SAW device. Steps in process 300 and its sub-processes 300a, 300b, and 300c are illustrated in greater detail in FIG. 2B.

Process 300 will be described with reference to FIGS. 3-23. The process will be described with reference to forming a single package, however it is to be understood that in some embodiments, the package 100 is a chip-scale package and the method may be applied to substrates to form a plurality of the chip-scale packages concurrently on common substrates. The substrates may be diced after forming the chip-scale packages to separate one from another.

Figure 3:
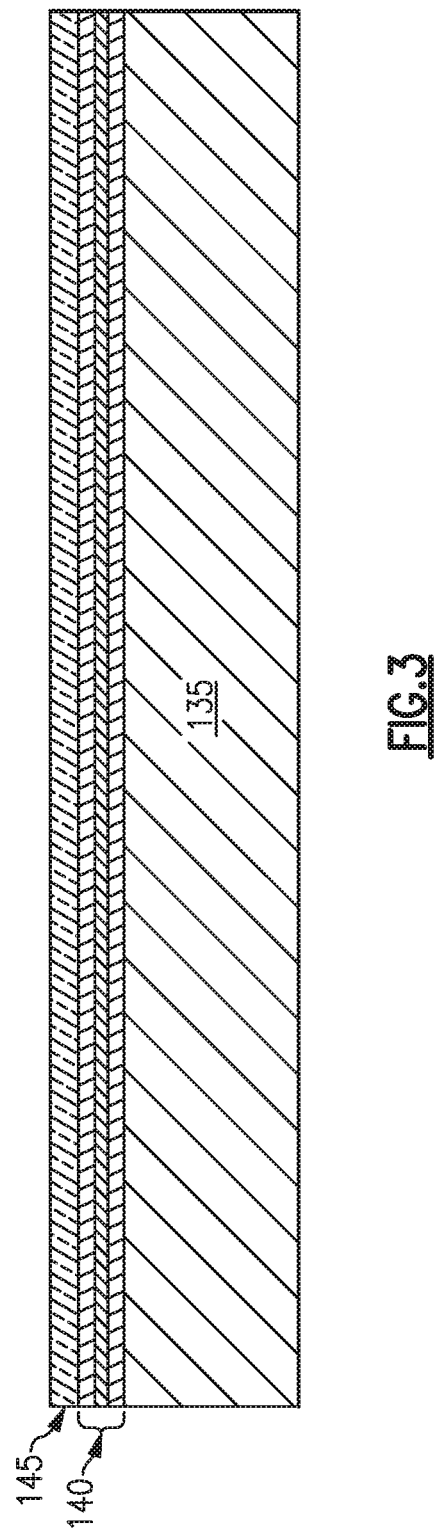
FIG. 3 illustrates an act in the method of FIG. 2B.

The process begins by providing a sacrificial carrier substrate 135, for example, a silicon wafer. In act 305 an adhesion/etch stop layer 140 is deposited on a first surface of the silicon wafer 135 (FIG. 3). In some embodiments, the adhesion/etch stop layer 140 includes a layer of gold (Au) sandwiched between layers of titanium (Ti). In some embodiments, the layer of Au and the layers of Ti of the adhesion/etch stop layer 140 may be between about 500 angstroms (Å) and about 1,000 Å thick each. The Ti and Au layers may be deposited by physical vapor deposition (sputtering or evaporative deposition) chemical vapor deposition (CVD) or any other deposition method known in the art. As also shown in FIG. 3, a sacrificial buffer layer 145 is deposited on the adhesion/etch stop layer 140 (act 310). In some embodiments, the sacrificial buffer layer 145 includes or consists of silicon dioxide ($SiO_2$) and is deposited by a spin-on glass process, CVD, or any other deposition method known in the art. In some embodiments, the sacrificial buffer layer 145 is between about 1 micron and about 5 microns thick.

Figure 4:
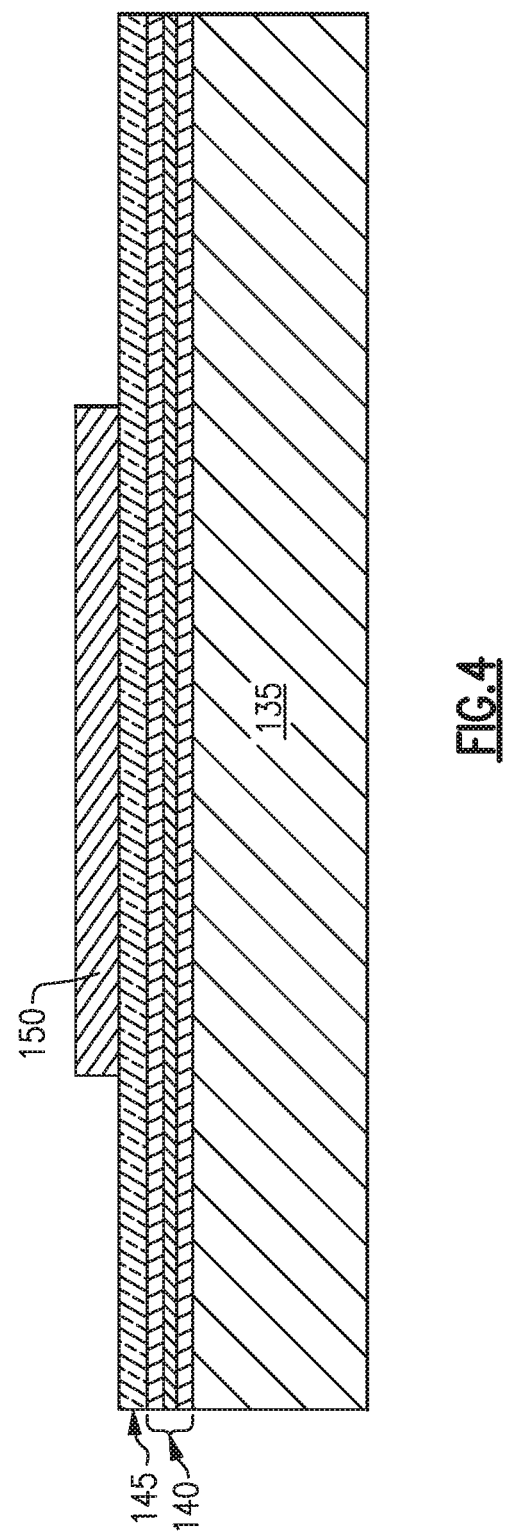
FIG. 4 illustrates an act in the method of FIG. 2B.

In act 315, as illustrated in FIG. 4, a metal layer 150 is deposited on the buffer layer 145. In some embodiments, the metal layer 150 includes or consists of, for example, tungsten (W), Ti, or a Ti-W alloy. The metal layer 150 may be between about 1 micron and about 5 microns thick. The metal layer 150 may be deposited by physical vapor deposition (sputtering or evaporative deposition) and may be patterned using standard lithographic and etching techniques. The thickness of the metal layer 150 may determine the height of the cavity 115 to be formed in the package 100.

Figure 5:
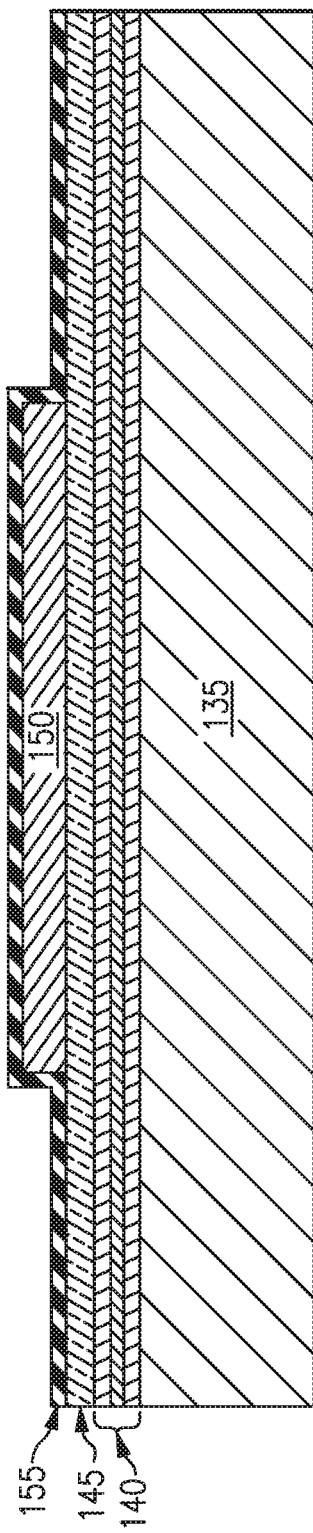
FIG. 5 illustrates an act in the method of FIG. 2B.

In act 320 a seal layer 155 is deposited on the metal layer 150 and the buffer layer 145 (FIG. 5). In some embodiments, the seal layer 155 includes or consists of silicon nitride ($Si_3N_4$). The seal layer may be between about 0.5 microns and about 1 micron thick. The seal layer 155 may be deposited by CVD or one of its variants, for example, plasma-enhanced chemical vapor deposition (PECVD). The seal layer 155 is used to provide a hermetic seal for the cavity 115 to be formed in the package 100 and may provide stress relief between components of the chip-scale package to eliminate bowing of the substrates.

Figure 6:
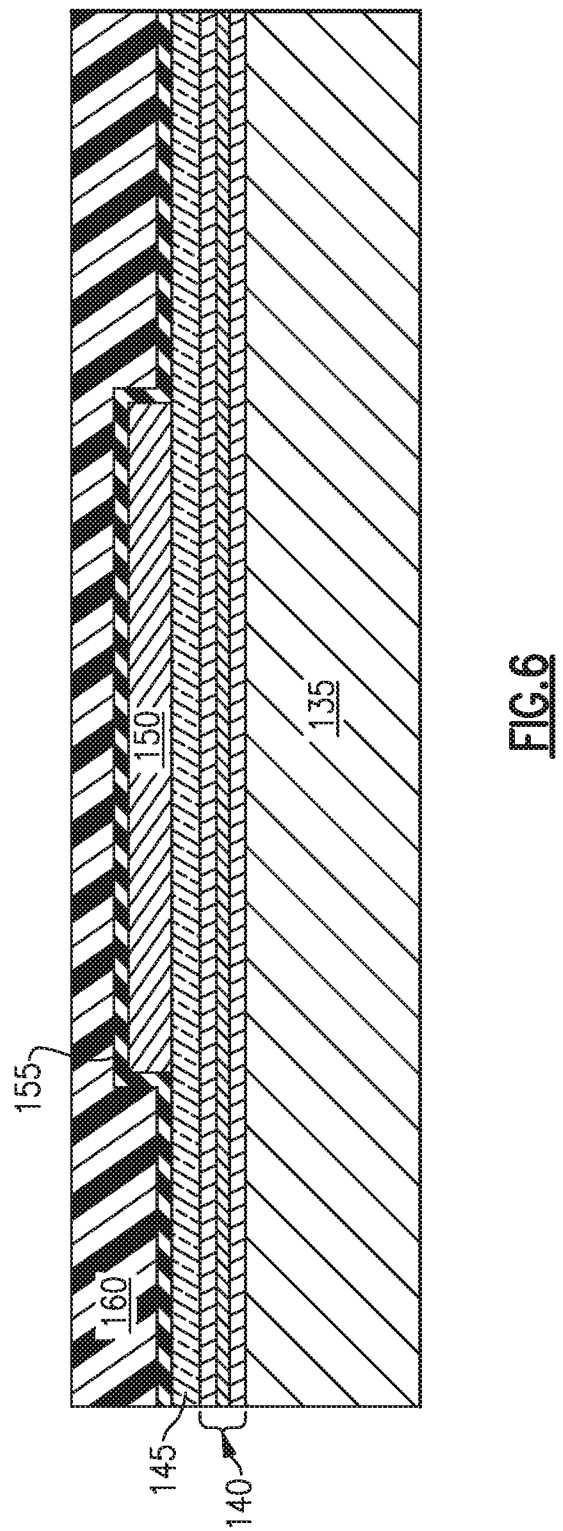
FIG. 6 illustrates an act in the method of FIG. 2B.

A first polymer layer 160 is deposited on the seal layer 155 (act 325, FIG. 6). In some embodiments, the first polymer layer 160 includes or consists of polyimide. The first polymer layer 160 may be deposited by a CVD process. The first polymer layer 160 may be between about 5 microns and 10 microns thick. The first polymer layer 160 provides mechanical support for the package 100 and may be used to planarize the surface over the metal layer 150 and seal layer 155.

Figure 7:
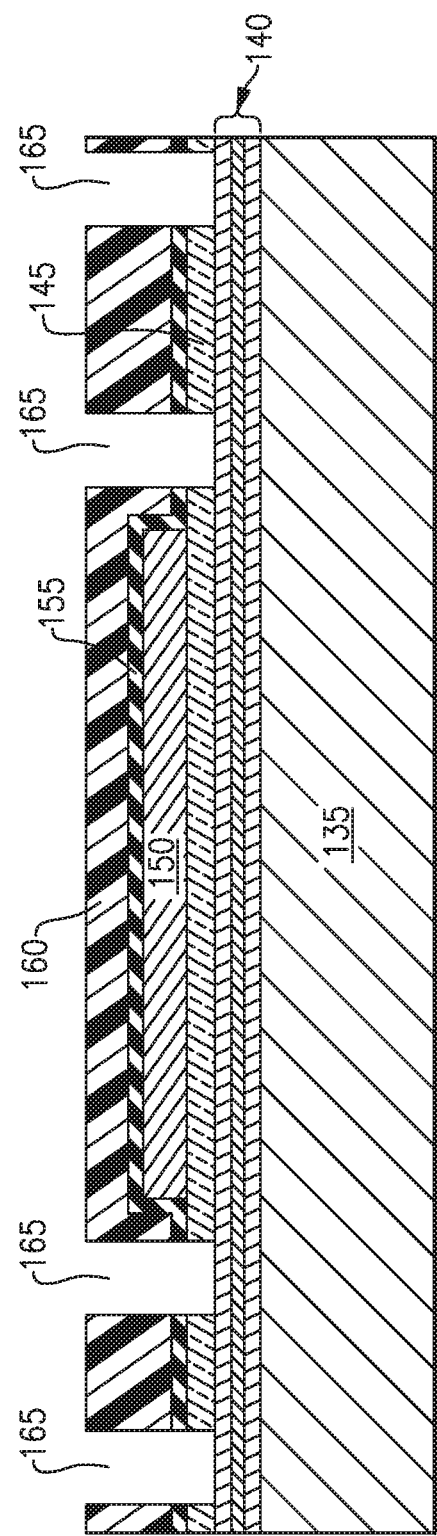
FIG. 7 illustrates an act in the method of FIG. 2B.

In act 330, as illustrated in FIG. 7, apertures 165 are etched through the first polymer layer 160, the seal layer 155, and the buffer layer 145. The apertures provide openings in which metal vias and a ring seal are to be formed.

Figure 8:
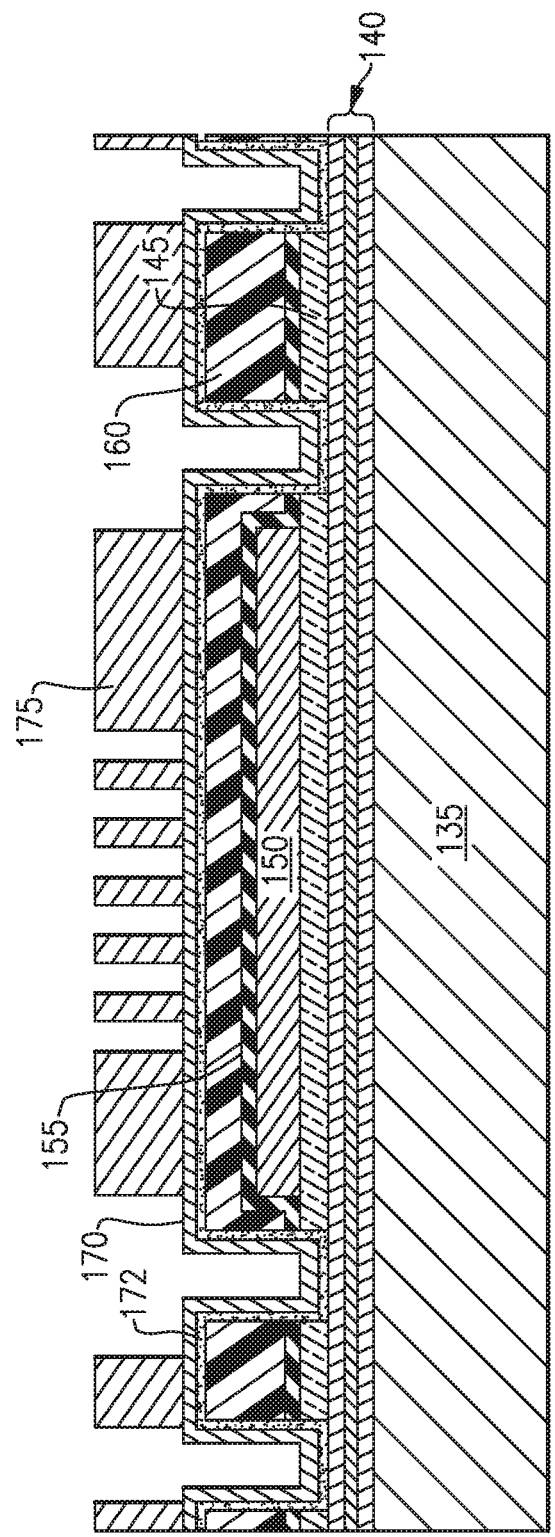
FIG. 8 illustrates an act in the method of FIG. 2B.

A metal seed layer 170 is deposited on the first polymer layer 160 and exposed portions of the adhesion/etch stop layer 140 (act 335, FIG. 8). The metal seed layer 170 may be deposited by physical vapor deposition (sputtering or evaporative deposition). The metal seed layer 170 may include or consist of copper (Cu) or a TiW—Au alloy. In some embodiments the metal seed layer 170 may include or be formed over an adhesion layer 172, for example, a layer of TiW the may be deposited on the first polymer layer 160 prior to an Au or Cu layer. As also illustrated in FIG. 8 a photoresist layer 175 is deposited on the metal seed layer 170 and patterned (act 340).

Figure 9:
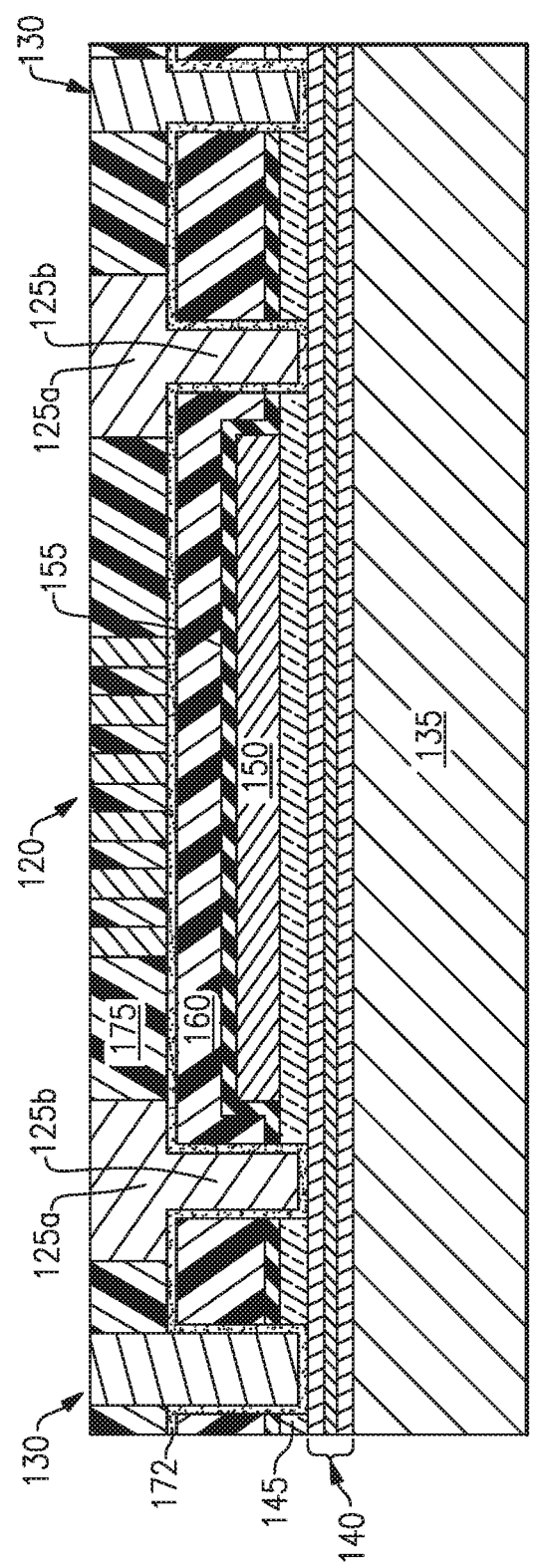
FIG. 9 illustrates an act in the method of FIG. 2B.

In act 345 and as illustrated in FIG. 9, a first metal layer is grown on the seed metal layer 170. The first metal layer defines the passive device 120, portions of the ring seal 130, and portions of the contact bumps 125 including middle portions 125a and lower portions 125b. The middle portions 125a and lower portions 125b of the contact bumps will form vias extending through the body of the package and provide electrical contact between elements of the package, for example, the IDT electrodes 110 and/or passive device 120 and the outside of the package. The first metal layer may comprise or consist of Au or Cu and may be deposited by electroplating.

Figure 10:
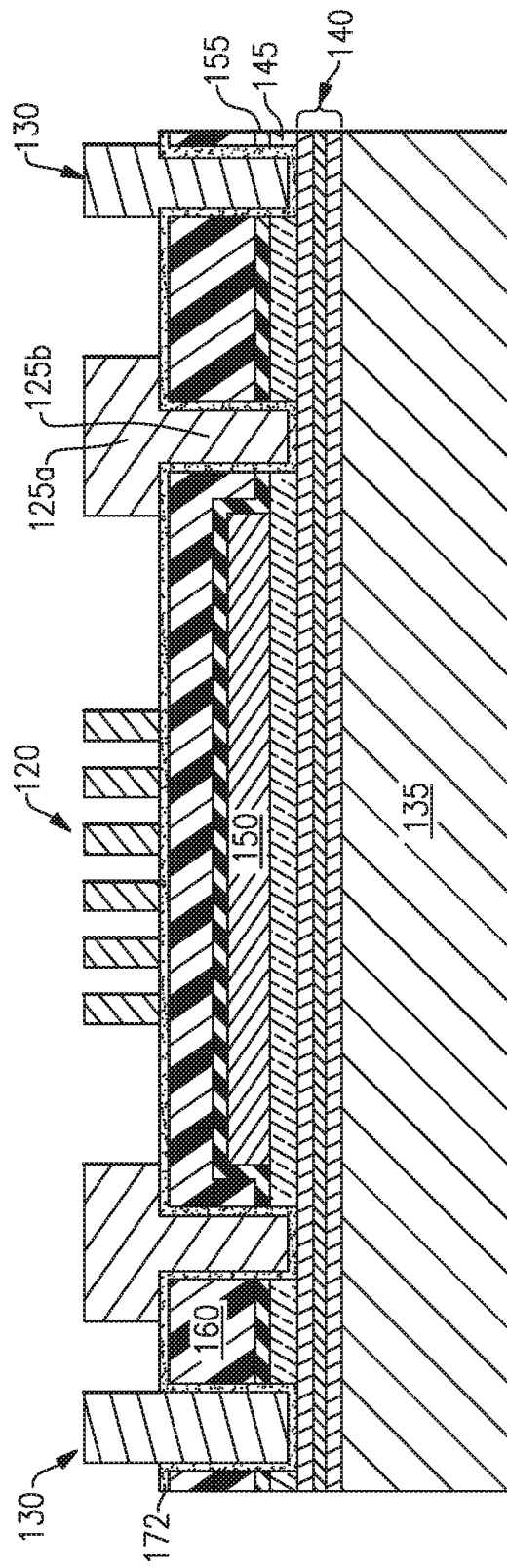
FIG. 10 illustrates an act in the method of FIG. 2B.

After the first metal layer is deposited, the photoresist 175 and portions of the metal seed layer 170 remaining on the upper surface of the first polymer layer 160 are removed by, for example, thermal processing, chemical dissolution and/or wet or dry etching (act 350, FIG. 10). Portions of the seed metal layer 170 located below the first metal layer and protected from removal in act 350 are omitted from FIG. 9 onward for ease of illustration.

Figure 11:
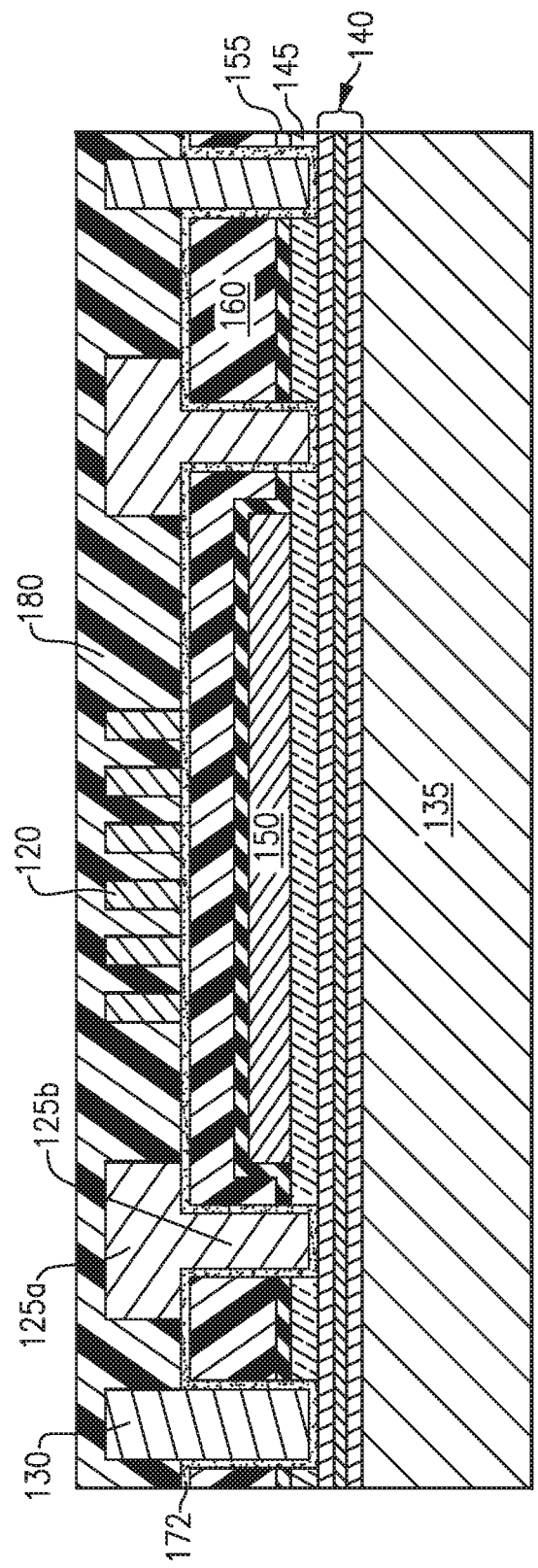
FIG. 11 illustrates an act in the method of FIG. 2B.

In act 355 and as illustrated in FIG. 11, a second polymer layer 180 is deposited on the first polymer layer 160, the passive device 120, the ring seal 130, and the middle portions 125a of the contact bumps. The second polymer layer 180 may comprise or consist of polyimide. The second polymer layer 180 may be between about 5 microns and about 10 microns thick. The second polymer layer 180 provides additional mechanical support for the package 100 and planarizes the partially formed package illustrated in FIG. 11 over the tops of the first polymer layer 160, the passive device 120, the ring seal 130, and the middle portions 125a of the contact bumps.

Figure 12:
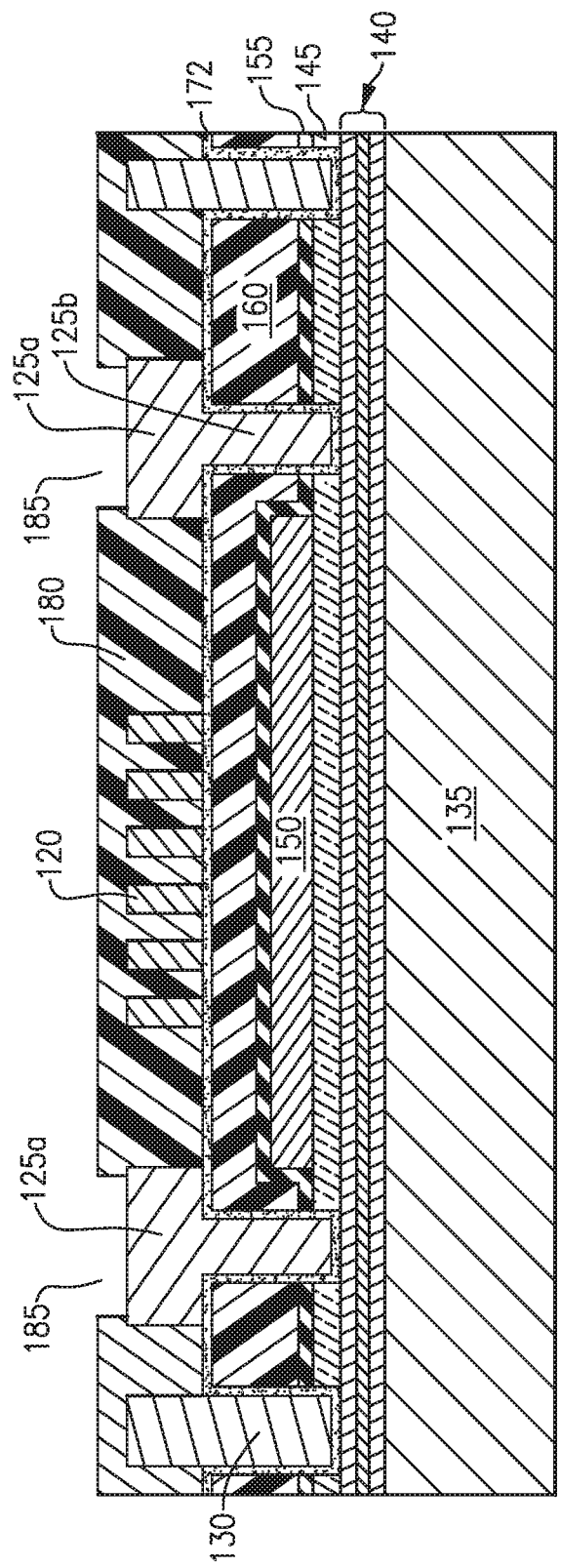
FIG. 12 illustrates an act in the method of FIG. 2B.
Figure 13:
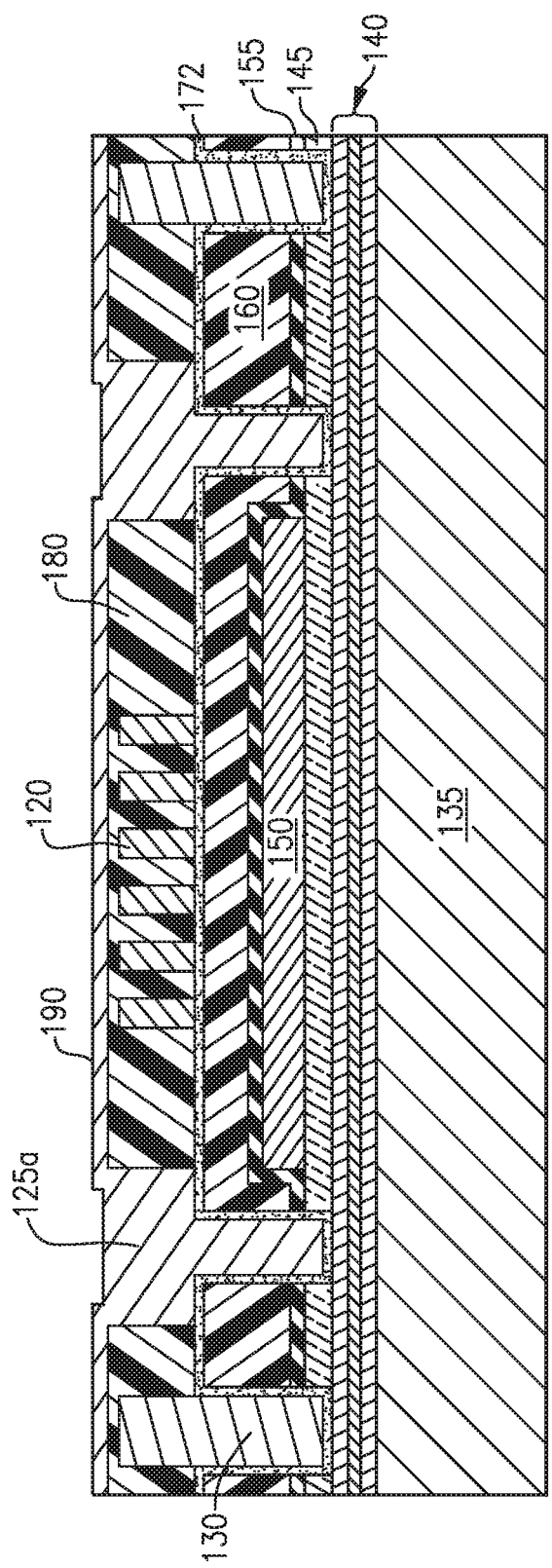
FIG. 13 illustrates an act in the method of FIG. 2B.

In act 360, and as shown in FIG. 12, apertures 185 are etched in the second polymer layer 180 over the middle portions 125a of the contact bumps. A second metal seed layer 190 is then deposited over the second polymer layer 180 and the middle portions 125a of the contact bumps (FIG. 13). The second metal seed layer 190 may be deposited by physical vapor deposition (sputtering or evaporative deposition). The second metal seed layer 190 may include or consist of Cu or a TiW—Au alloy.

Figure 14:
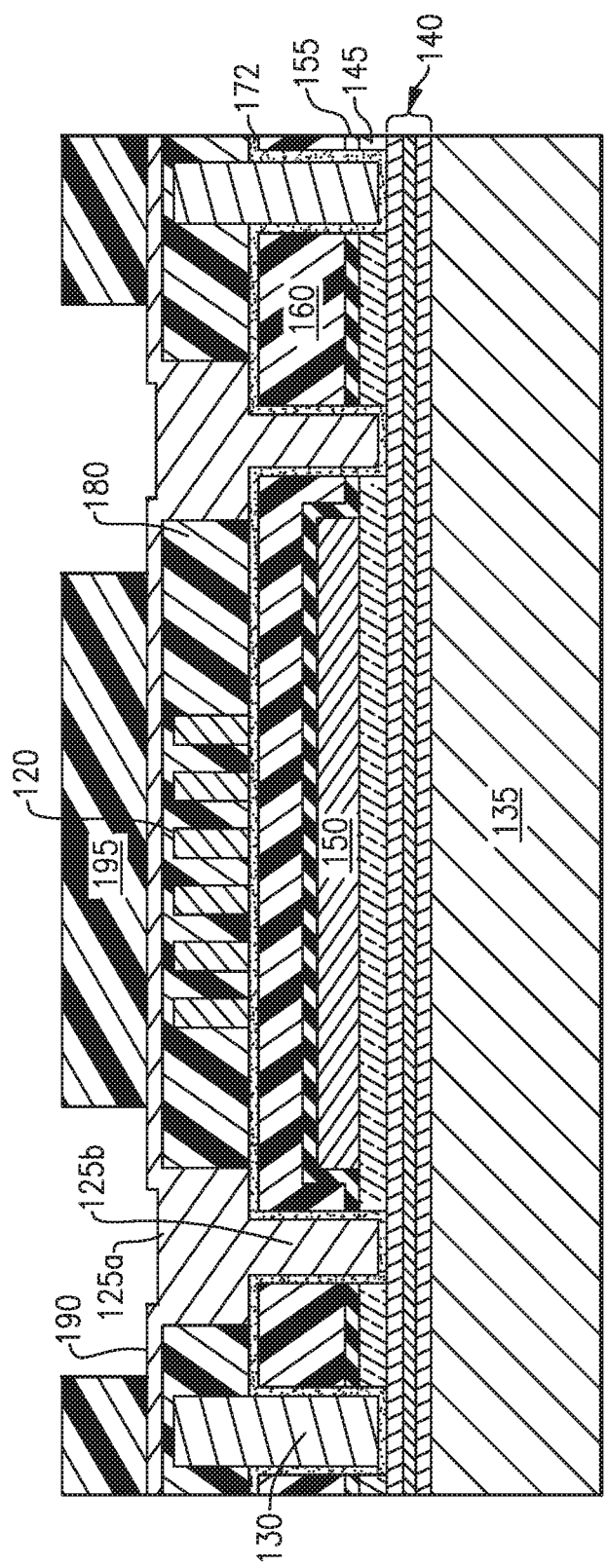
FIG. 14 illustrates an act in the method of FIG. 2B.
Figure 15:
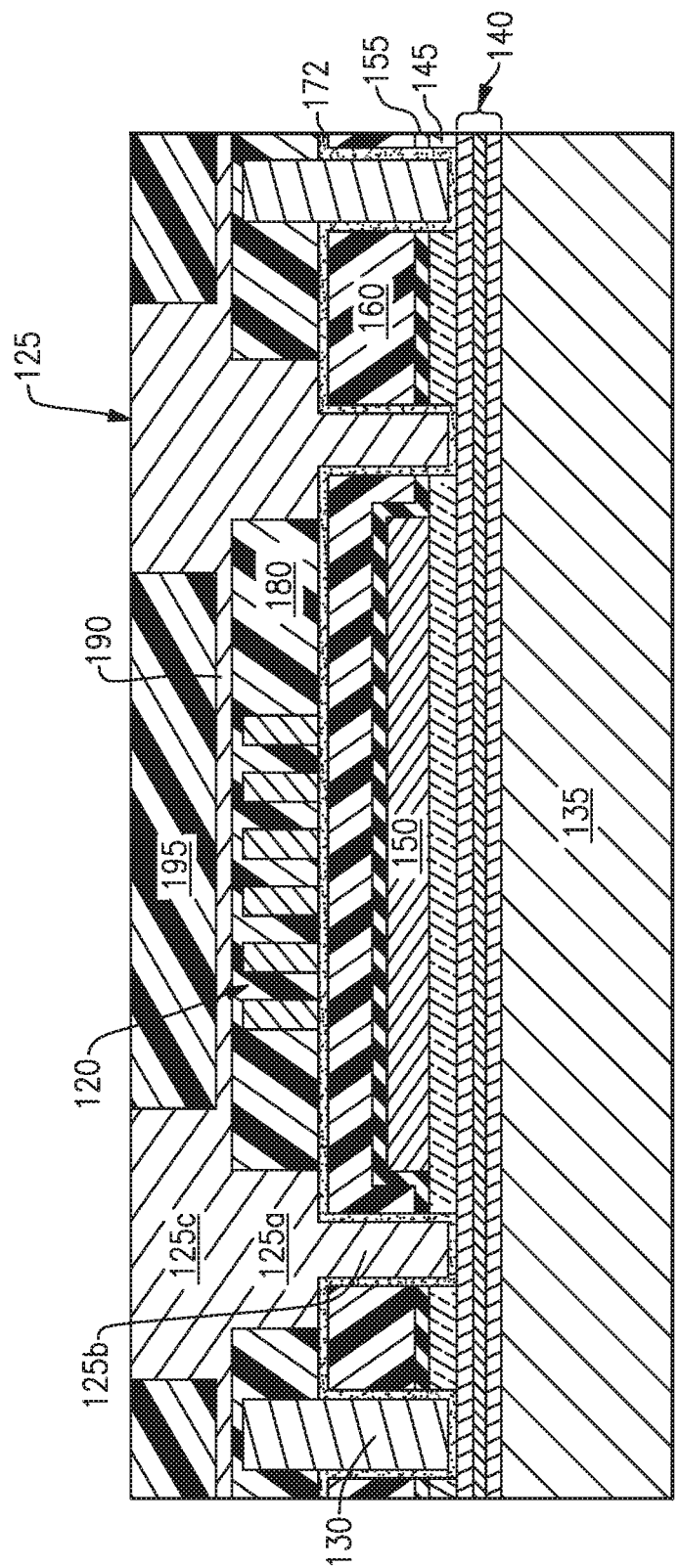
FIG. 15 illustrates an act in the method of FIG. 2B.
Figure 16:
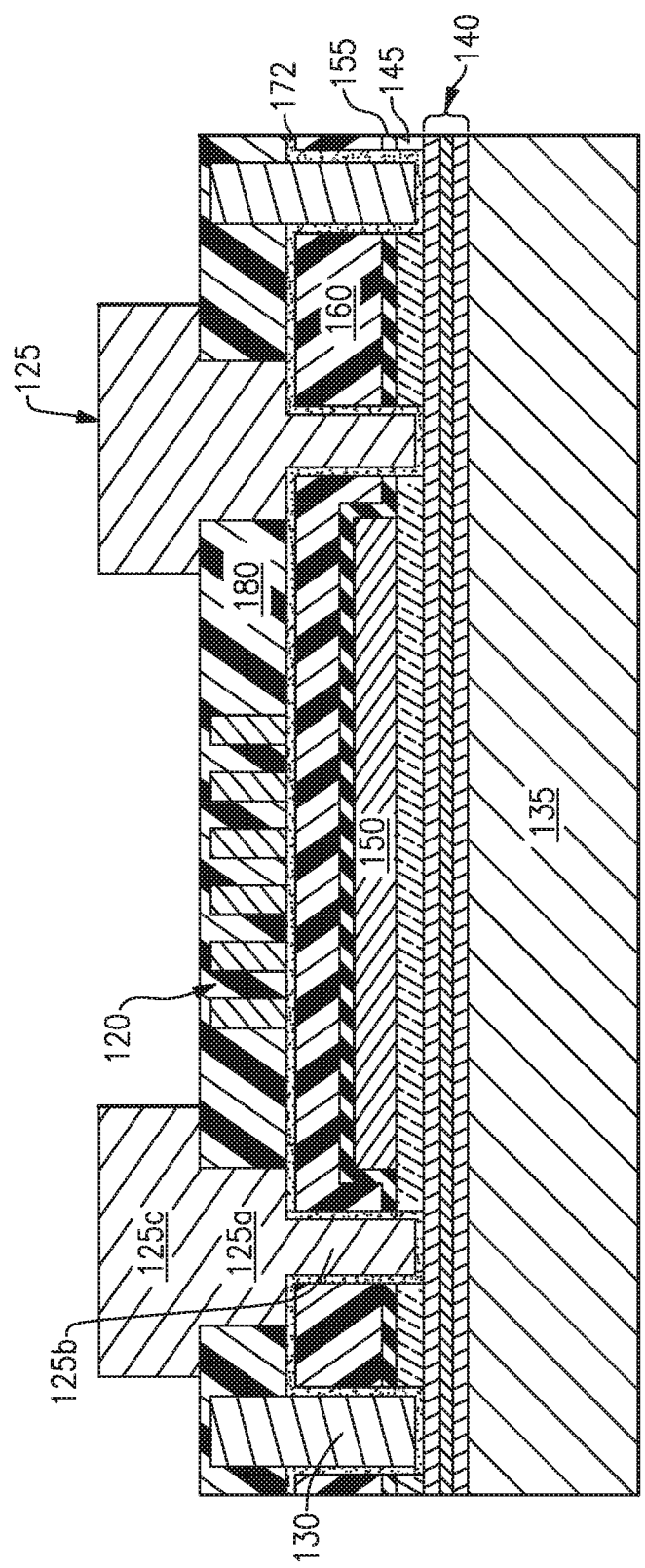
FIG. 16 illustrates an act in the method of FIG. 2B.

A second layer of photoresist 195 is deposited on the second metal seed layer 190 and patterned to form apertures above the middle portions 125a of the contact bumps (act 370, FIG. 14). A second layer of metal, including or consisting of Cu or a TiW—Au alloy is grown on the second metal seed layer 190, for example, by electroplating, to form upper portions 125c of the contact bumps (act 375, FIG. 15), after which the second layer of photoresist 195 and exposed regions of the second metal seed layer 190 are removed by, for example, thermal processing, chemical dissolution and/or wet or dry etching (act 380, FIG. 16).

Figure 17:
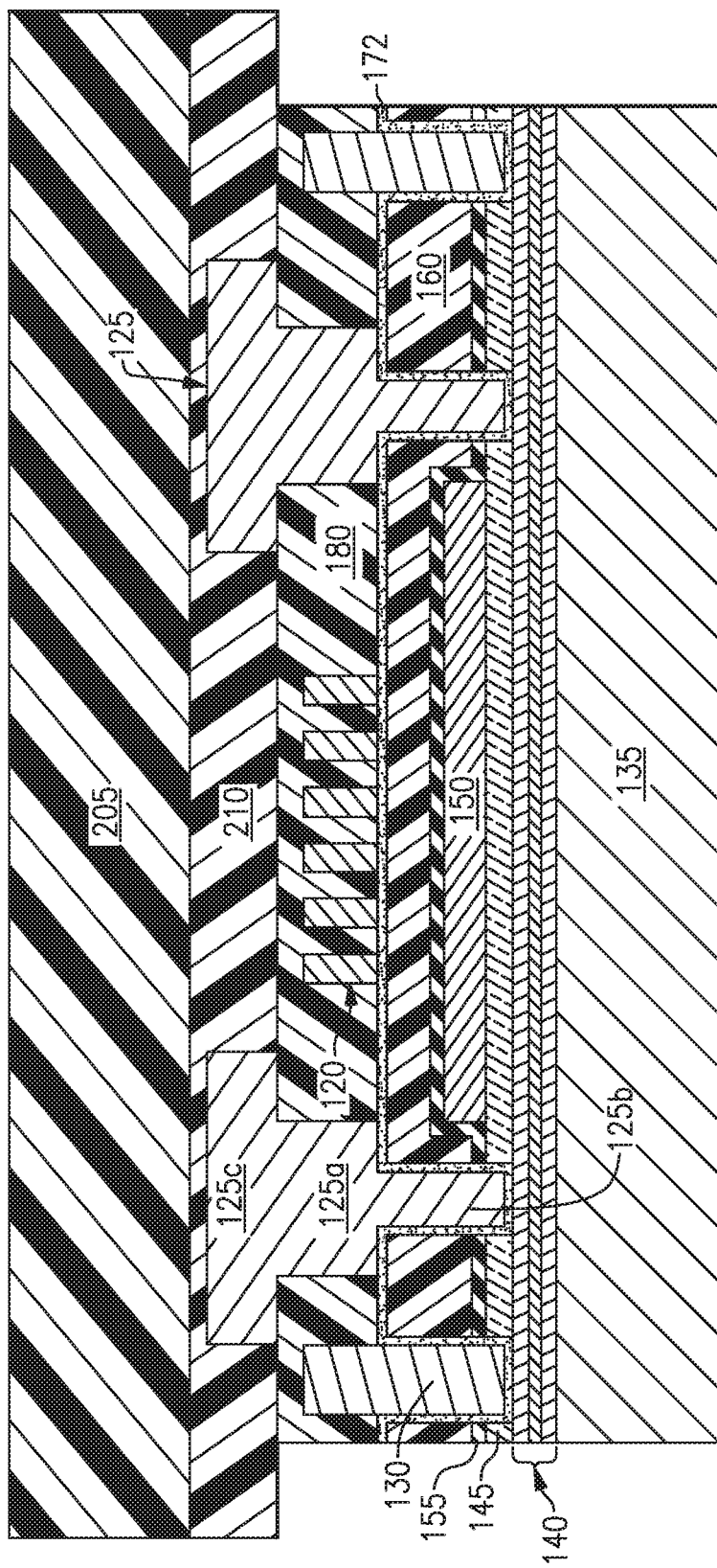
FIG. 17 illustrates an act in the method of FIG. 2B.

In act 385, FIG. 17, a carrier wafer 205 is attached to the top of the second polymer layer 180 and the upper portions 125c of the contact bumps using a temporary bonding material 210. In some embodiments, the carrier wafer 205 is a sapphire or $LiTaO_3$ wafer and the temporary bonding material 210 is a bonding material such as WaferBOND® HT-10.10 temporary bonding material available from Brewer Science, Inc., Rolla, Mo. or any other temporary wafer bonding material known in the art.

Figure 18:
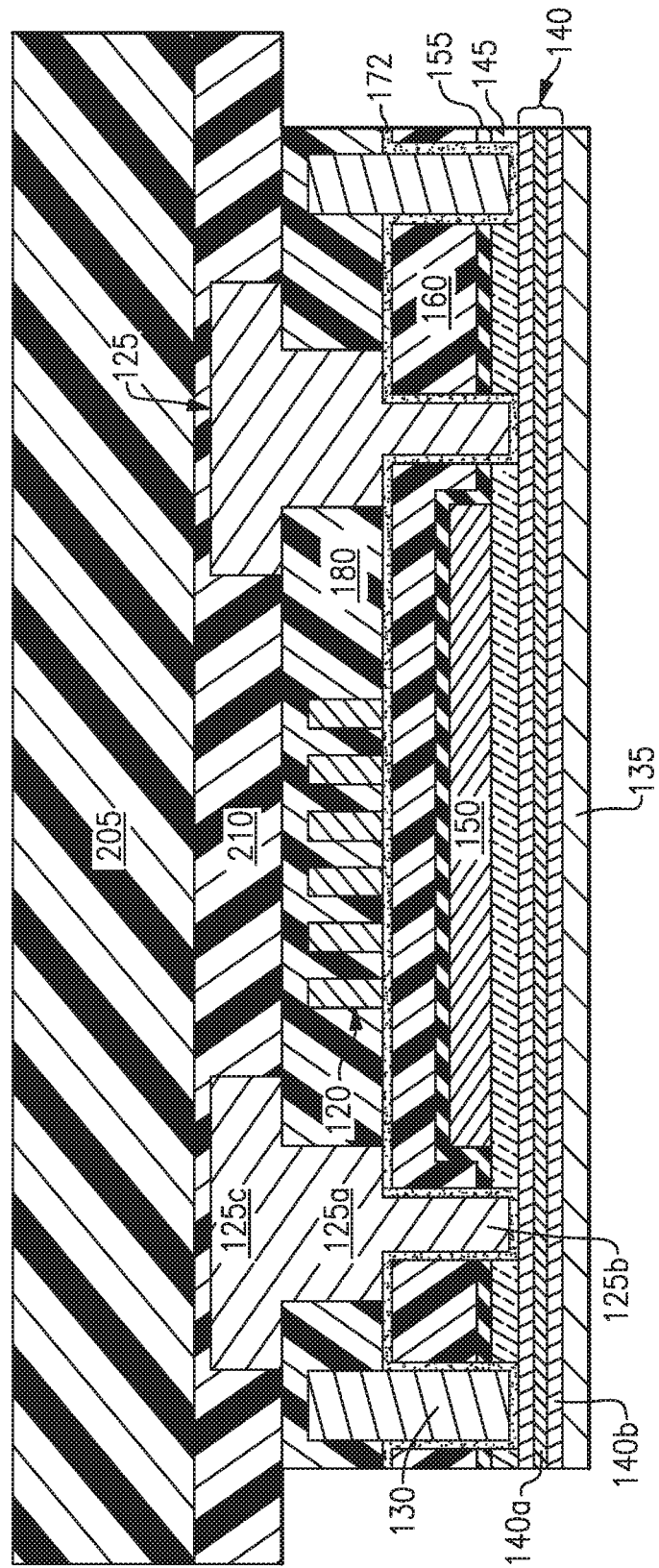
FIG. 18 illustrates an act in the method of FIG. 2B.
Figure 19:
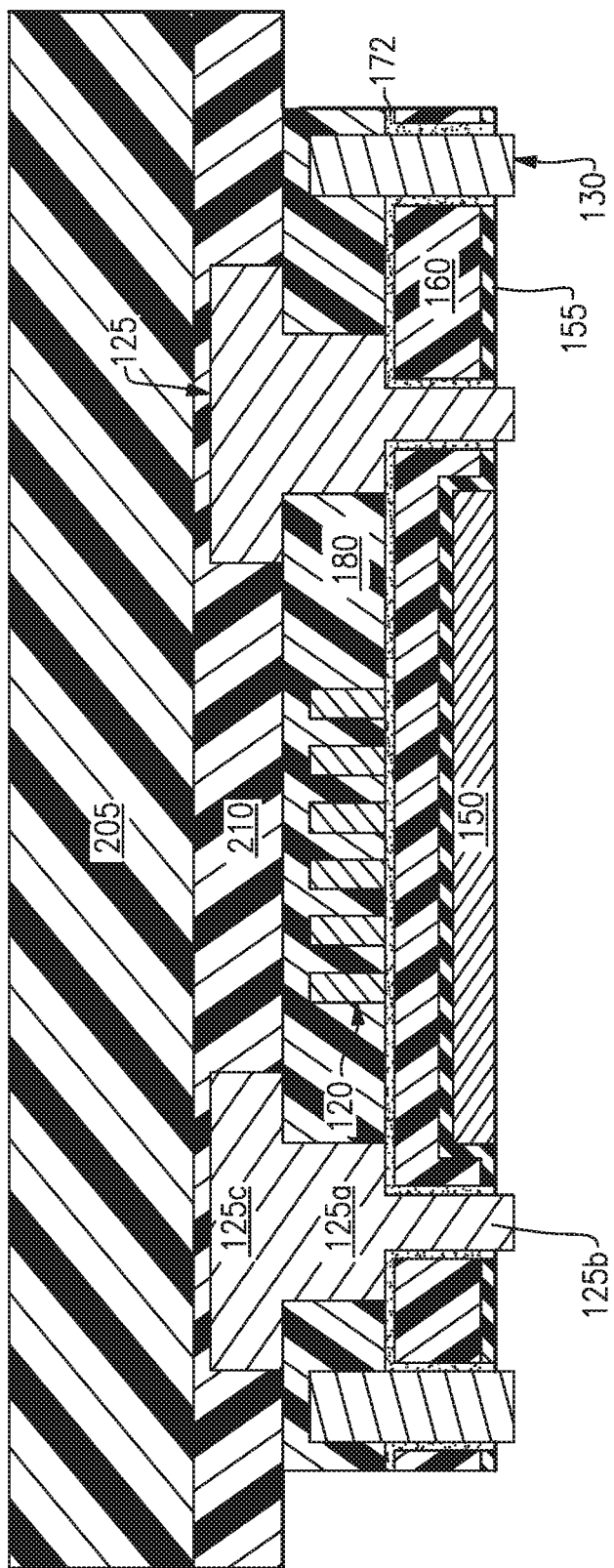
FIG. 19 illustrates an act in the method of FIG. 2B.

After the carrier wafer 205 has been attached, the sacrificial carrier substrate 135 is removed (act 390, FIG. 18). The sacrificial carrier substrate 135 may be removed by grinding to remove the bulk of the material followed by dry or wet etching with the Au layer in the adhesion/etch stop layer 140 acting as an etch stop. The adhesion/etch stop layer 140 and the buffer layer 145 are then removed as well (act 395, FIG. 19) to expose the bottom of the metal layer 150 and the seal layer 155. In some embodiments, the Ti layer 140b in the adhesion/etch stop layer 140 remaining after the Au 140a layer is removed and the buffer layer 145 are removed by chemical etching in HF. In some embodiments, the seal ring 130 and lower portions 125b of the contact bumps may have a thin layer of TiW seed layer 172 which protects them from being etched by the HF and that is later removed by, for example, a chemical clean with $H_2O_2$.

Figure 20:
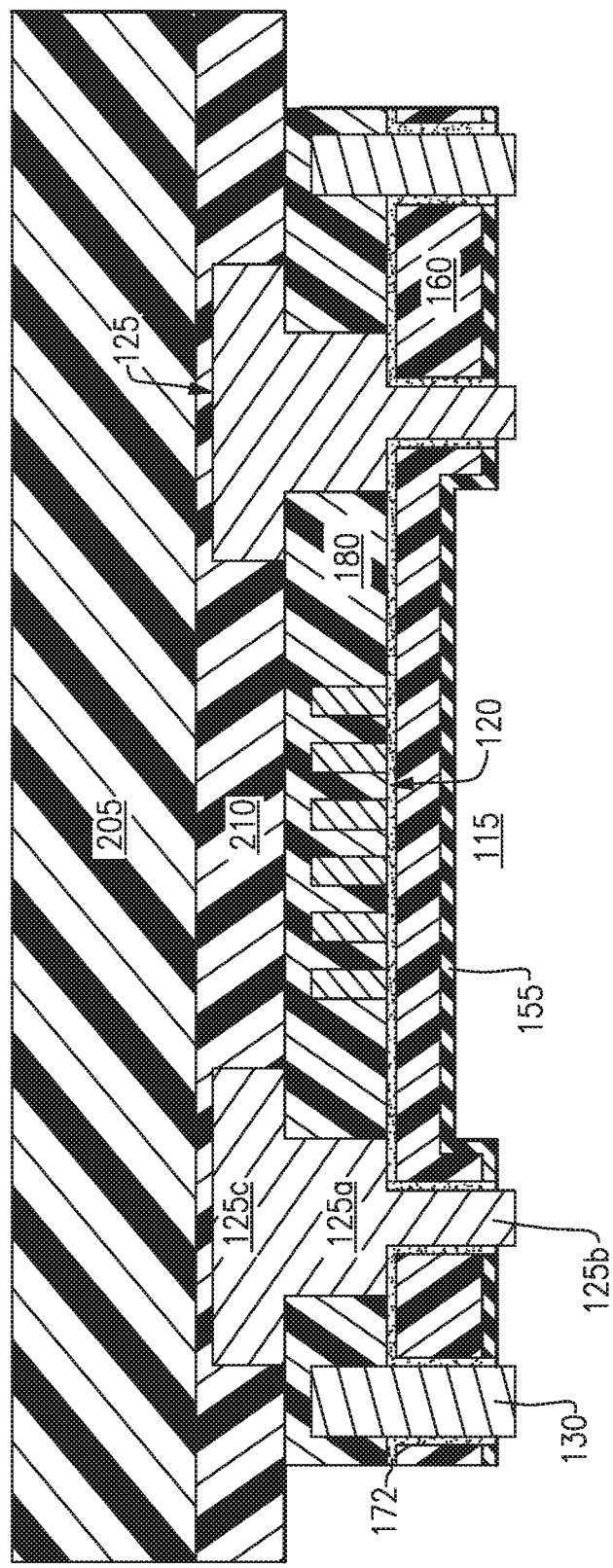
FIG. 20 illustrates an act in the method of FIG. 2B.

In act 400, and as illustrated in FIG. 20, the metal layer 150 is removed, for example, by wet etching leaving behind the cavity 115.

Figure 21:
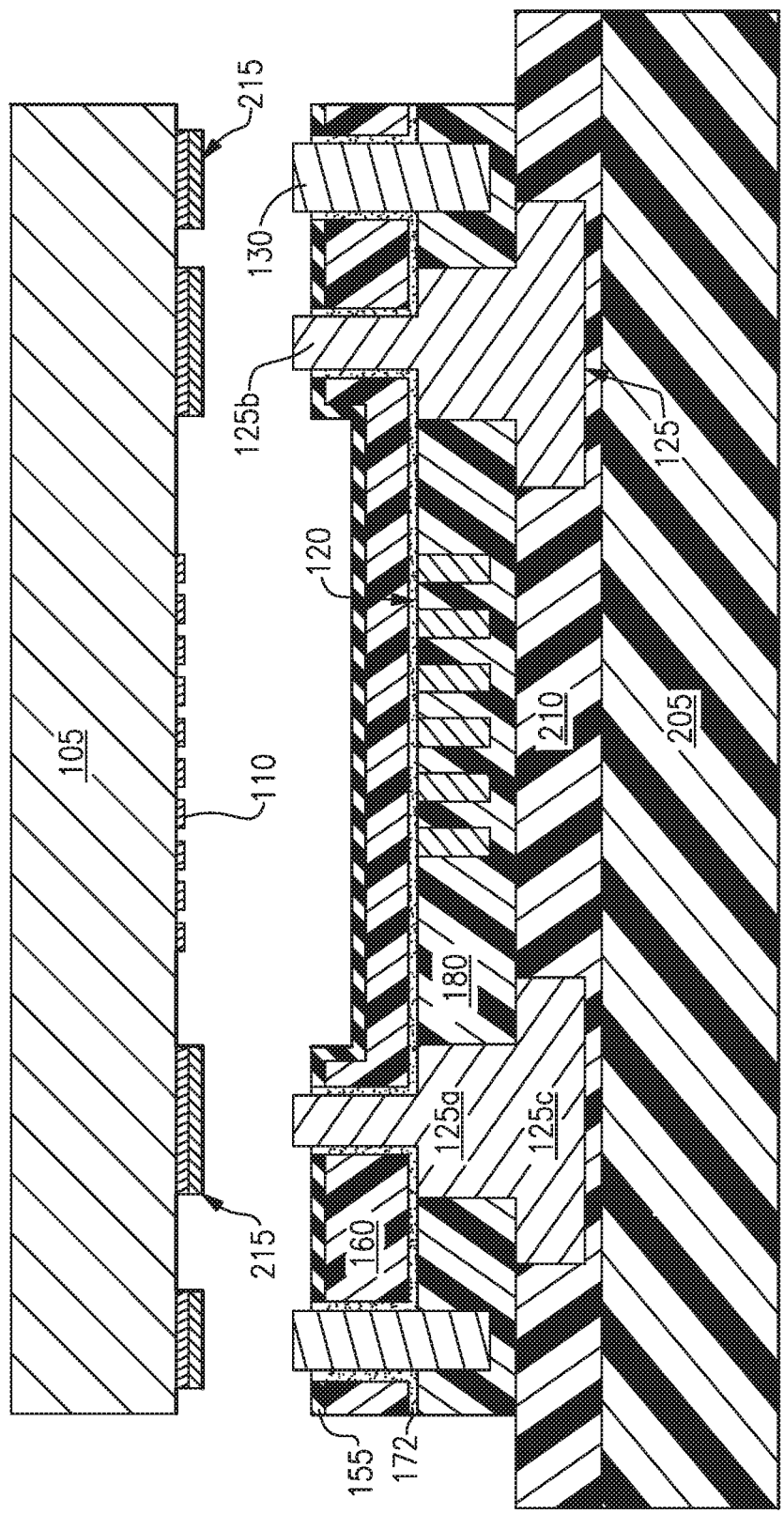
FIG. 21 illustrates an act in the method of FIG. 2B.
Figure 22:
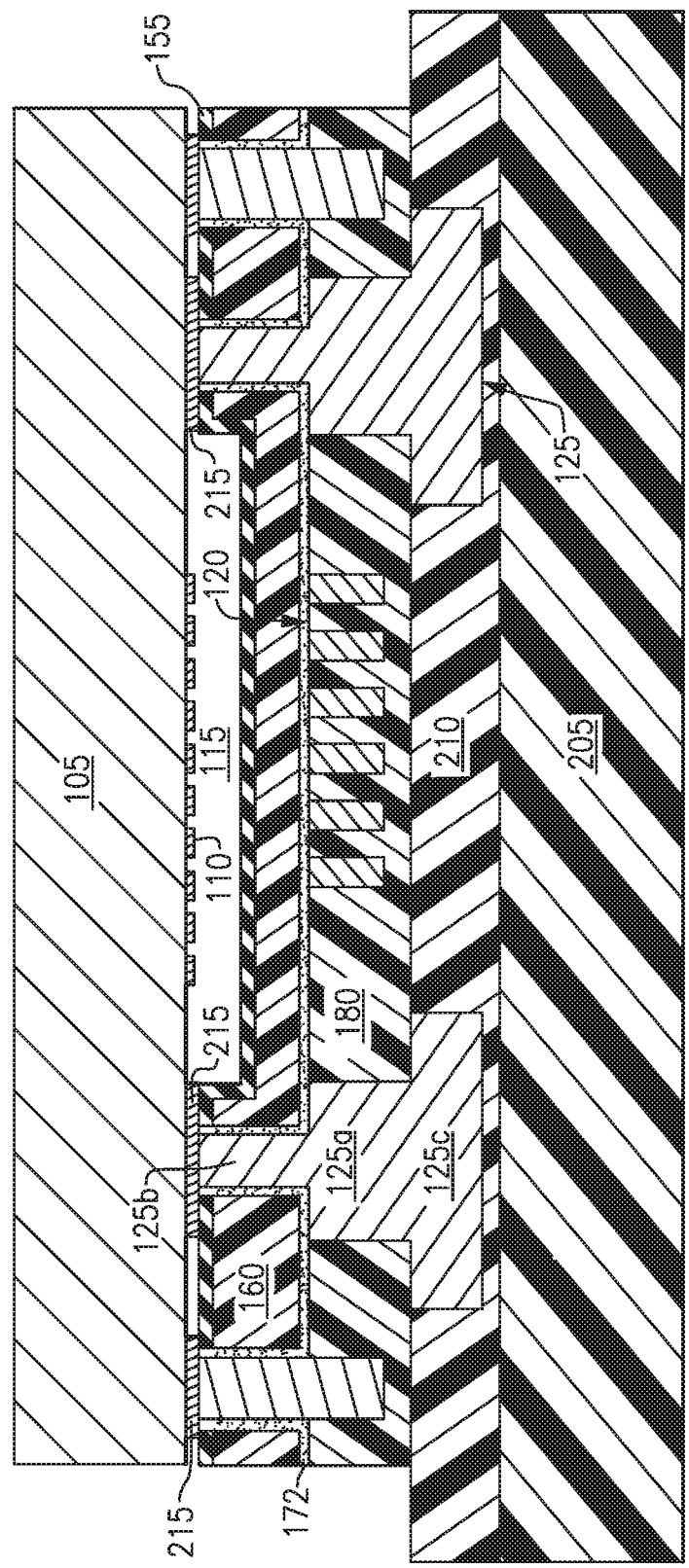
FIG. 22 illustrates an act in the method of FIG. 2B.

The partially formed package may then be inverted, as illustrated in FIG. 21, and the piezoelectric substrate 105, having the IDT electrodes 110 already formed thereon is bonded to the seal ring 130 and the lower portions 125b of the contact bumps 125 (act 405, FIG. 22). In some embodiments, a bonding material structure 215, for example, a transient liquid phase bonding structure including a layer of Au and a layer of indium (In) is used to bond the piezoelectric substrate 105 to the seal ring 130 and the lower portions 125b of the contact bumps 125. In other embodiments a solder bond is used to bond the piezoelectric substrate 105 to the seal ring 130 and the lower portions 125b of the contact bumps 125.

Figure 23:
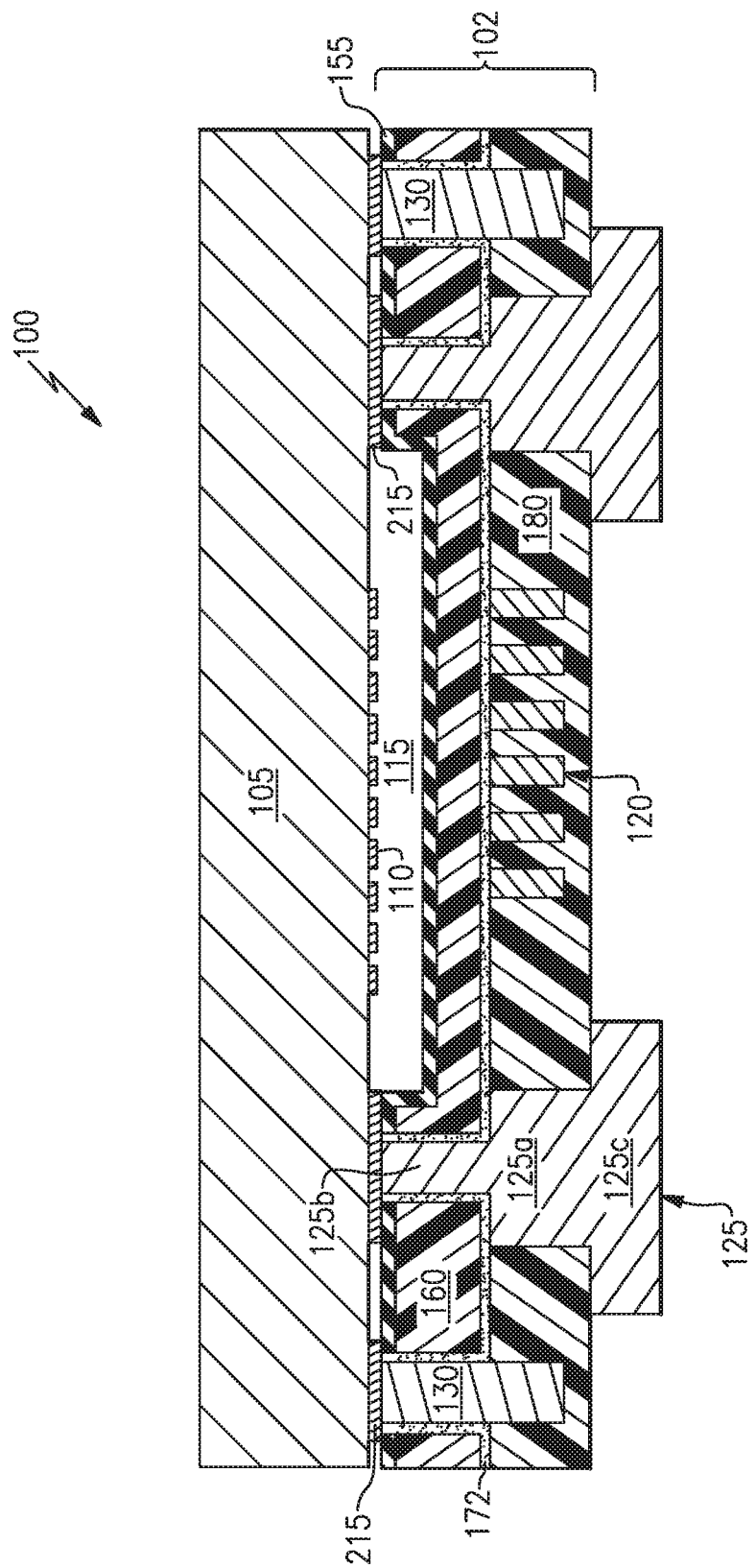
FIG. 23 illustrates an act in the method of FIG. 2B.

In act 410, FIG. 23, the temporary bonding material 210 is removed, for example, by thermal decomposition or dissolution in a solvent to allow the carrier wafer 205 to be removed and for the package 100 to be finalized. The piezoelectric substrate 105 is then diced to separate a plurality of the packages 100 formed with the process 300 from one another.

Figure 24:
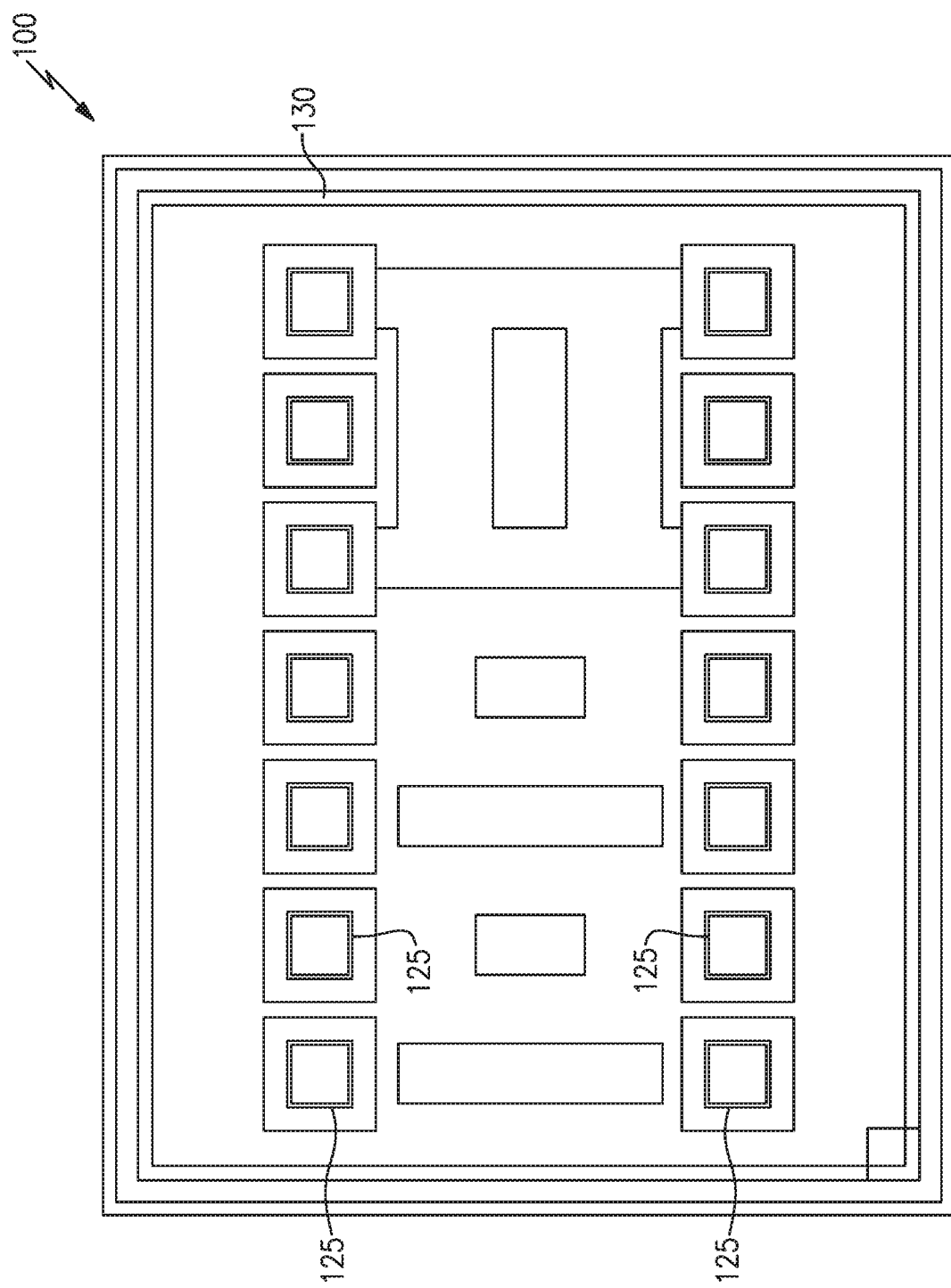
FIG. 24 is a plan view of the bottom of the package of FIG. 1.

A plan view of the top (or the bottom when viewed as in FIG. 23) of a finished package 100 is illustrated in FIG. 24, in which the contact bumps 125 and seal ring 130 are visible.

Figure 25:
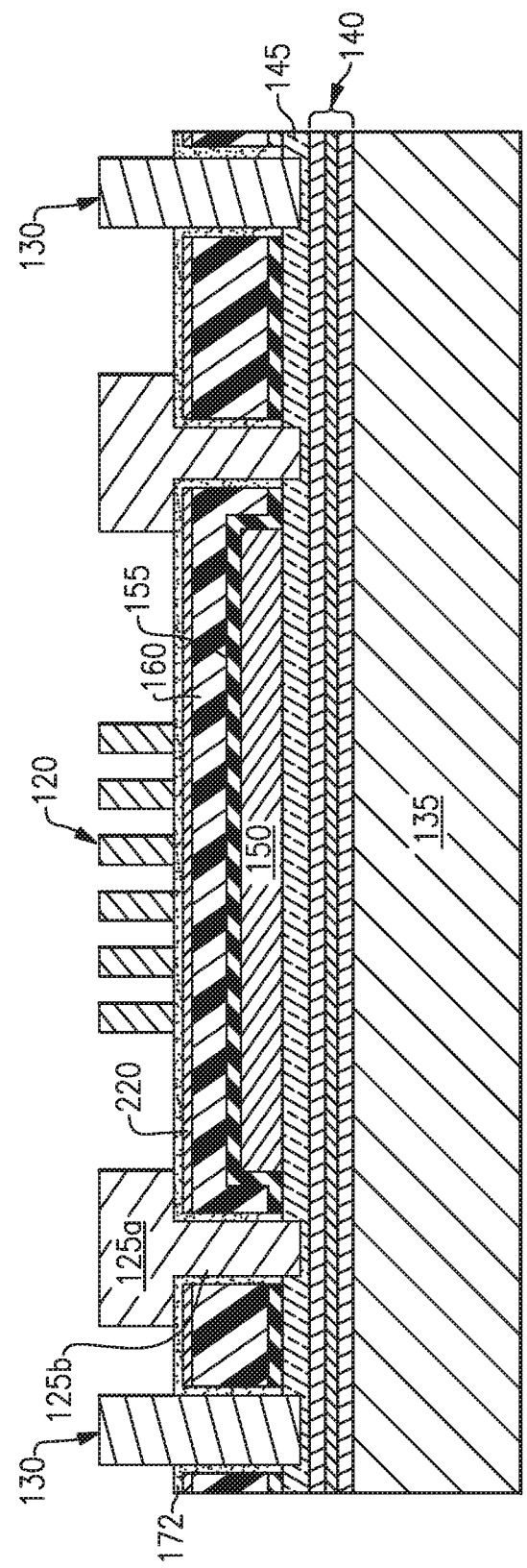
FIG. 25 is a cross-sectional side view of another example of a wafer-level chip-scale package.

Various amendments and alterations may be made to the process of forming the packaged MEMS device. For example, as illustrated in FIG. 25, a second seal layer 220 may be formed on top of the first polymer layer 160. The second seal layer 220 may be formed from $Si_3N_4$. The second seal layer 220 may improve the hermeticity of the cavity 115 and provide for control of stress in the package 100.

Figure 26:
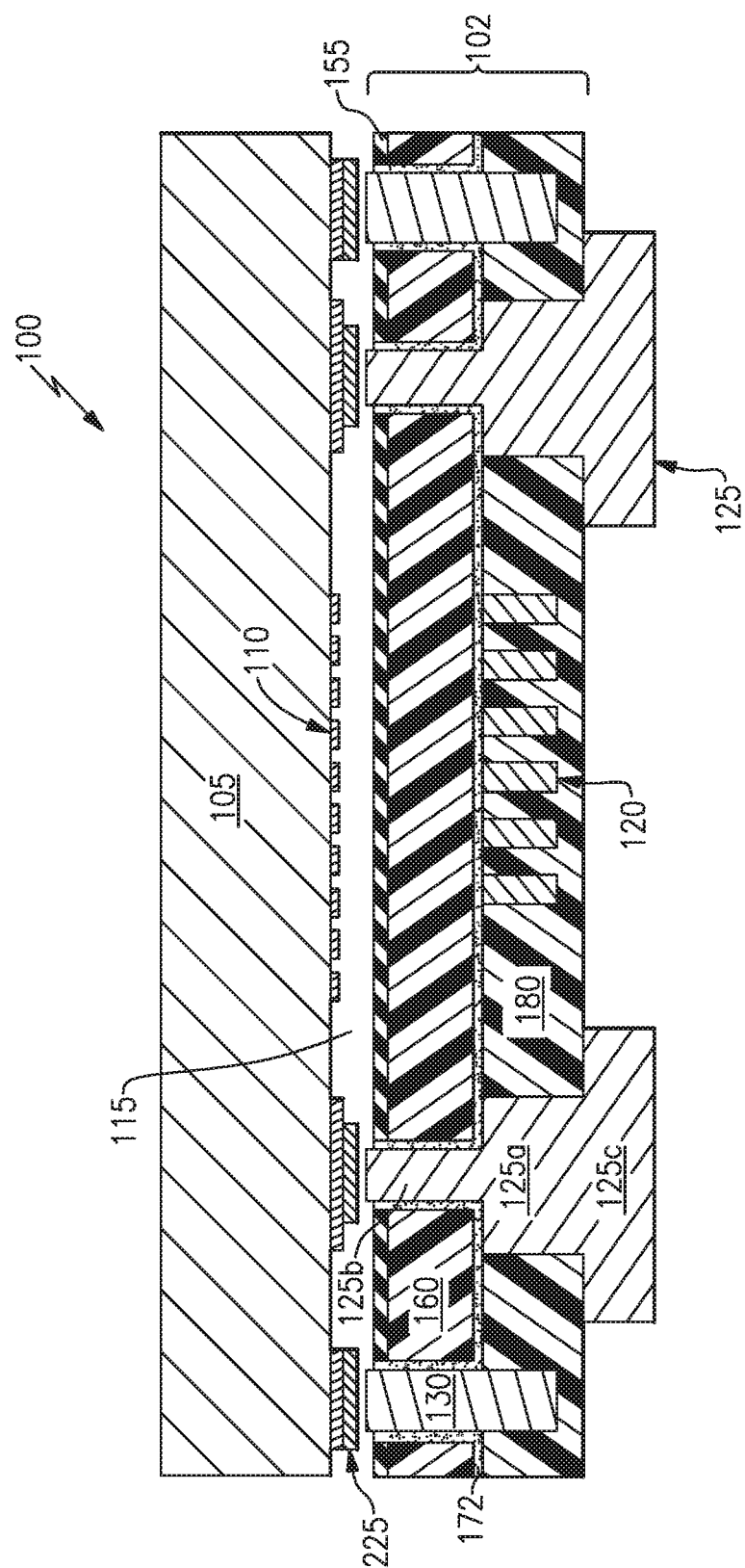
FIG. 26 is a cross-sectional side view of another example of a wafer-level chip-scale package.

In another embodiment, illustrated in FIG. 26, a metal standoff layer 225 may be incorporated into one or more of the bonding material structures. The metal standoff layer 225 may remain solid at temperatures used to secure the piezoelectric substrate 105 to the seal ring 130 and the lower portions 125b of the contact bumps 125 with the bonding structures. The thickness of the metal standoff layer 225, in combination with the thickness of the buffer layer 145 may be selected to provide the cavity 115 with a desired depth.

Figure 27:
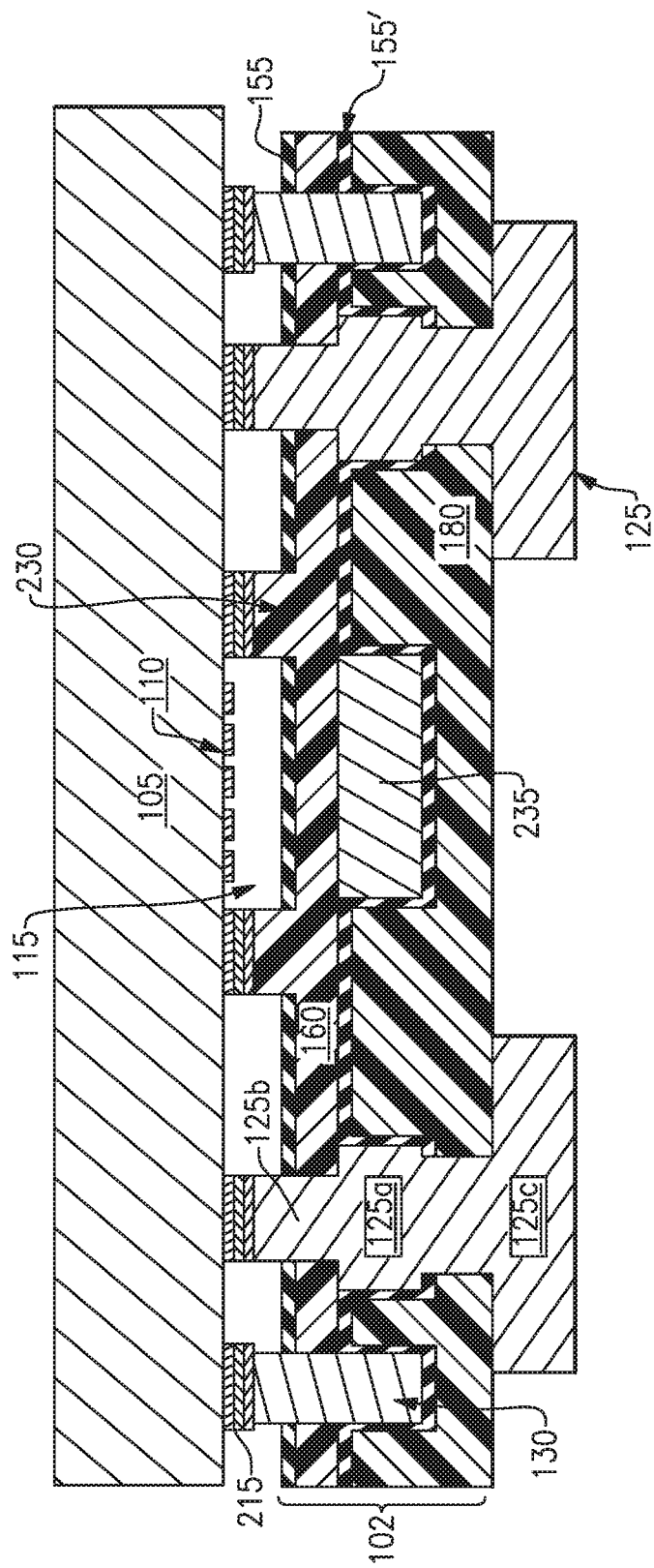
FIG. 27 is a cross-sectional side view of another example of a wafer-level chip-scale package.

As an alternative or as an addition to the metal standoff layer 225, the depth of the cavity 115 may be selected by providing one or more polymer standoffs 230, as illustrated in FIG. 27. In some embodiments, the polymer standoffs 230 are formed from the same material as the first polymer layer 160 and/or second polymer layer 180 and may be formed in the same process steps as the first polymer layer 160. The polymer standoffs 230 may provide a non-conductive support mechanism for the cavity 115. The polymer standoffs 230 may define lateral ends of the cavity 115. As is also illustrated in FIG. 27, a second nitride layer 155' may be disposed over the upper end (shown inverted in FIG. 27) and side portions of the seal ring 130 and side portions of the middle portions 125a of the contact bumps. Additionally, in some embodiments, a metal roof 235 may be incorporated into one of the first polymer layer 160 and the second polymer layer 180 to provide additional mechanical support for the package.

Figure 28:
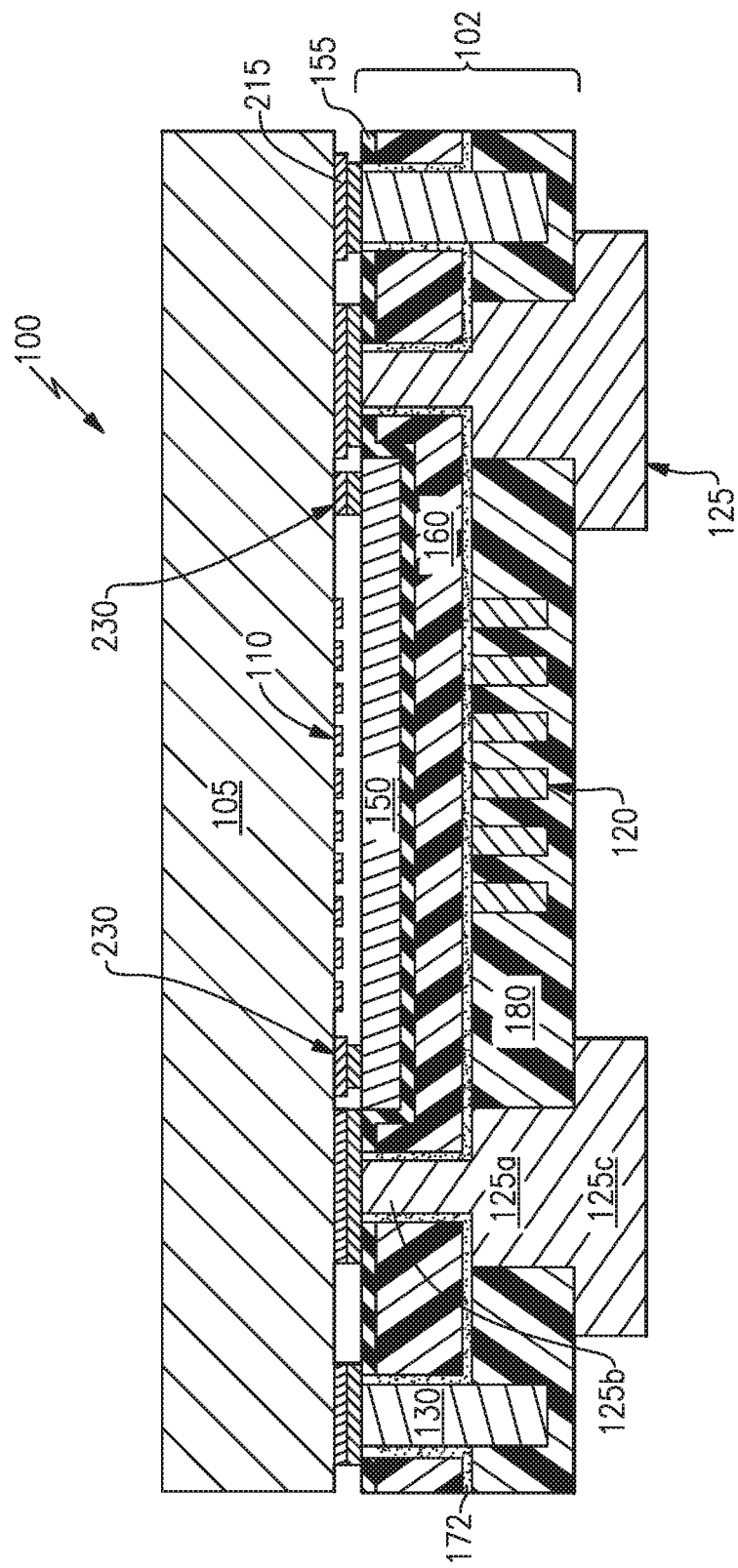
FIG. 28 is a cross-sectional side view of another example of a wafer-level chip-scale package.
Figure 29:
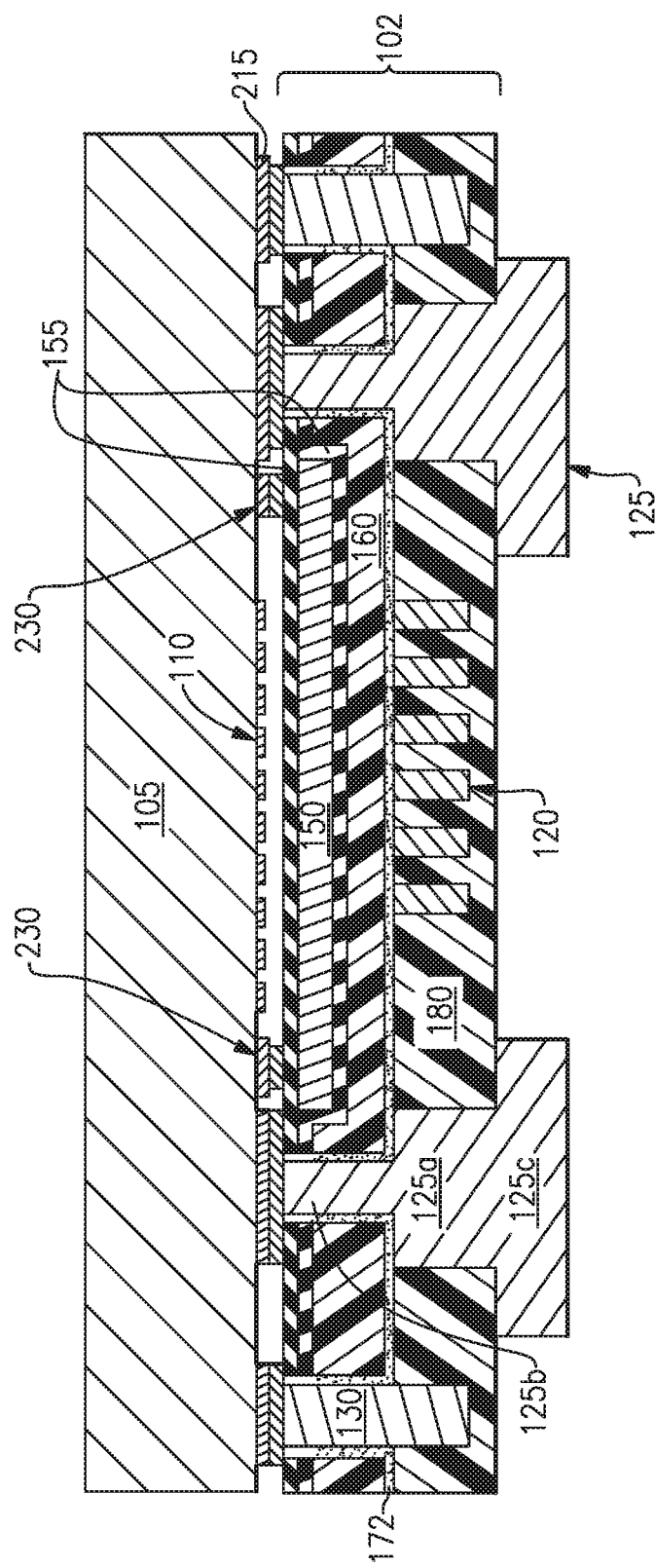
FIG. 29 is a cross-sectional side view of another example of a wafer-level chip-scale package.

In a further embodiment, illustrated in FIG. 28, the metal layer 150 is not removed from the package during fabrication. The metal layer 150 may provide additional mechanical support for the package and additional hermeticity to the cavity. Metal standoffs 230 may space the metal layer from the piezoelectric substrate 105 so the metal layer 150 does not contact the IDT electrodes. In some embodiments, the metal standoffs 230 are deposited in the same process steps as the bonding material structures 215 or metal standoff layer 225. In some embodiments, as illustrated in FIG. 29 an additional layer 155 of $Si_3N_4$ or other dielectric may be deposited on the side of the metal layer 150 facing the piezoelectric substrate 105 so that the metal layer 150 is encapsulated in dielectric material.

It will be appreciated by those skilled in the art, given the benefit of this disclosure, that configuring components or devices, such as an elastic wave filter, an antenna duplexer, a module, or a communications device, for example, to use embodiments of the chip-scale package according to this disclosure can realize such components or devices having enhanced or improved features through the benefits provided by the chip-scale package.

Figure 30:
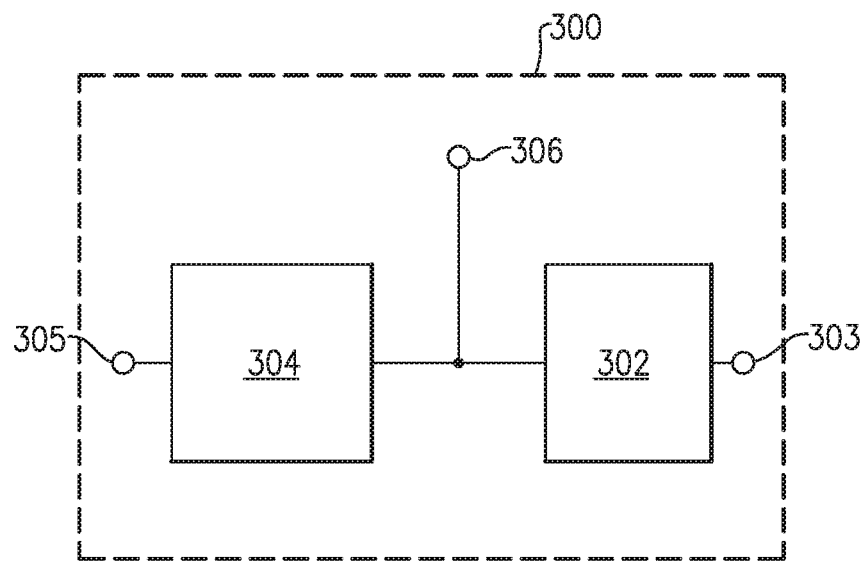
FIG. 30 is a block diagram of one example of an antenna duplexer incorporating a wafer-level chip-scale package according to aspects of the present invention.

According to one embodiment, a chip-scale package including an elastic wave device may be used to provide an antenna duplexer having improved characteristics. FIG. 30 illustrates a block diagram of one example of an antenna duplexer which can incorporate embodiments of the chip-scale package disclosed herein. The antenna duplexer 300 includes a transmission filter 302 and a reception filter 304 that are connected to a shared antenna terminal 306. The transmission filter 302 includes a transmit terminal 303 for connecting the transmission filter to transmitter circuitry (not shown), and the reception filter includes a receive terminal 305 for connecting the reception filter to receiver circuitry (not shown). Either or both of the transmission filter 302 and the reception filter 304 can include one or more of the wafer-level chip-scale packaged elastic wave devices as disclosed herein. By configuring the antenna duplexer 300 to use the chip-scale packaged elastic wave devices, an antenna duplexer having improved characteristics and enhanced performance (resulting from the improved characteristics of the wafer-level chip-scale packaged elastic wave devices discussed above) can be realized.

Figure 31:
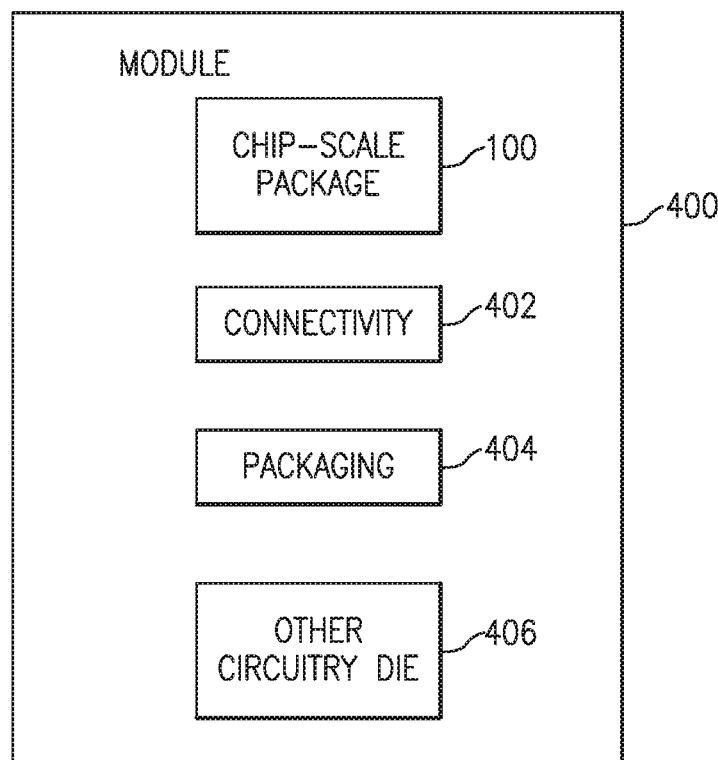
FIG. 31 is a block diagram of one example of a module incorporating a wafer-level chip-scale package according to aspects of the present invention.

Further, embodiments of the chip-scale packaged elastic wave devices may be incorporated, optionally as part of the antenna duplexer 300, into a module that may ultimately be used in a device, such as a wireless communications device, for example, so as to provide a module having enhanced performance FIG. 31 is a block diagram illustrating one example of a module 400 including an embodiment of a chip-scale packaged elastic wave device 100. The module 400 further includes connectivity 402 to provide signal interconnections, packaging 404, such as for example, a package substrate, for packaging of the circuitry, and other circuitry die 406, such as, for example amplifiers, pre-filters, modulators, demodulators, down converters, and the like, as would be known to one of skill in the art of semiconductor fabrication in view of the disclosure herein. In certain embodiments, the chip-scale packaged elastic wave device 100 in module 400 may be replaced with the antenna duplexer 300, so as to provide an RF module, for example.

Figure 32:
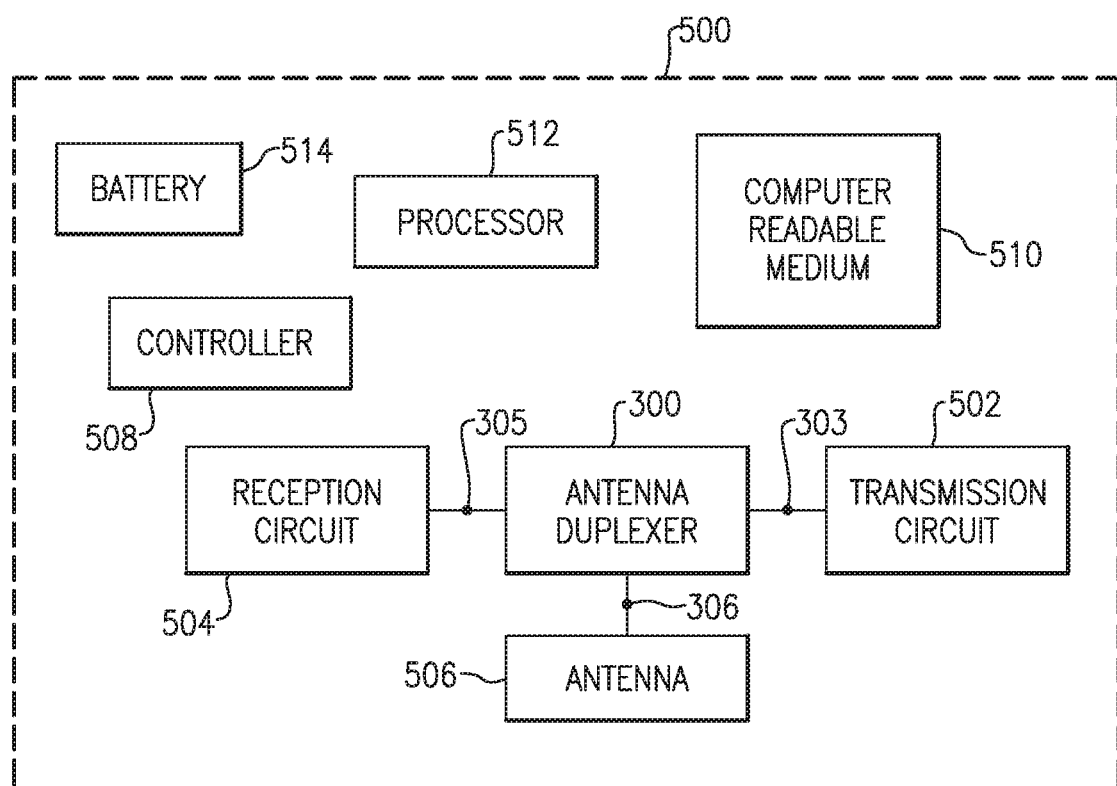
FIG. 32 is a block diagram of one example of a communications device incorporating the antenna duplexer of FIG. 30, according aspects of the present invention.

Furthermore, configuring an elastic wave filter and/or antenna duplexer to use embodiments of the chip-scale packaged elastic wave device can achieve the effect of realizing a communication device having enhanced performance using the same. FIG. 32 is a schematic block diagram of one example of a communication device 500 (e.g., a wireless or mobile device) that can include the antenna duplexer 300 incorporating one or more chip-scale packaged elastic wave devices, as discussed above. The communication device 500 can represent a multi-band and/or multi-mode device such as a multi-band/multi-mode mobile phone, for example. In certain embodiments, the communication device 500 can include the antenna duplexer 300, a transmission circuit 502 connected to the antenna duplexer via the transmit terminal 303, a reception circuit 504 connected to the antenna duplexer 300 via the receive terminal 305, and an antenna 506 connected to the antenna duplexer via the antenna terminal 306. The transmission circuit 502 and reception circuit 504 may be part of a transceiver that can generate RF signals for transmission via the antenna 506 and can receive incoming RF signals from the antenna 506. The communication device 500 can further include a controller 508, a computer readable medium 510, a processor 512, and a battery 514.

It will be understood that various functionalities associated with the transmission and receiving of RF signals can be achieved by one or more components that are represented in FIG. 32 as the transmission circuit 502 and the reception circuit 504. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 32 as the antenna 506. For example, a single antenna can be configured to provide both transmitting and receiving functionalities. In another example, transmitting and receiving functionalities can be provided by separate antennas. In yet another example in which the communication device is a multi-band device, different bands associated with the communication device 500 can be provided with different antennas.

To facilitate switching between receive and transmit paths, the antenna duplexer 300 can be configured to electrically connect the antenna 506 to a selected transmit or receive path. Thus, the antenna duplexer 300 can provide a number of switching functionalities associated with an operation of the communication device 500. In addition, as discussed above, the antenna duplexer 300 may include the transmission filter 302 and reception filter 304, which are configured to provide filtering of the RF signals. As discussed above, either or both of the transmission filter 302 and reception filter 304 can include embodiments of the chip-scale packaged elastic wave device, and thereby provide enhanced features and/or performance through the benefits of the ability to downsize and improved connection reliability achieved using embodiments of the chip-scale packaged elastic wave device. In certain examples, the antenna duplexer 300 in the communication device 500 can be replaced with a module 400, which includes the antenna duplexer, as discussed above.

As shown in FIG. 32, in certain embodiments, a controller 508 can be provided for controlling various functionalities associated with operations of the antenna duplexer 300 and/or other operating component(s). In certain embodiments, a processor 512 can be configured to facilitate implementation of various processes for operation of the communication device 500. The processes performed by the processor 512 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 500. In certain embodiments, these computer program instructions may also be stored in the computer-readable medium 510. The battery 514 can be any suitable battery for use in the communication device 500, including, for example, a lithium-ion battery.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation. Any dimensions provided in the above disclosure are meant as examples only and are not intended to be limiting.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A method of forming a wafer-level chip-scale package, the wafer-level chip-scale package including a device disposed on a piezoelectric substrate, the method comprising:
   forming a body of the package on a surface of a sacrificial semiconductor wafer;
   forming conductive vias passing through the body;

forming contact bumps in electrical connection with lower ends of the conductive vias at lower portions of the body;

forming a metal seal ring within the body;

removing the sacrificial semiconductor wafer from the body;

forming a cavity within the body; and bonding a lower surface of the piezoelectric substrate directly to upper ends of the conductive vias and to the seal ring to position the device within the cavity with the piezoelectric substrate defining an upper wall of the cavity.

2. The method of claim 1 wherein forming the cavity in the body includes forming a metal layer on the surface of the sacrificial semiconductor wafer prior to forming the body on the sacrificial semiconductor wafer and removing the metal layer subsequent to forming the body on the surface of the sacrificial semiconductor wafer.

3. The method of claim 1 wherein forming the device includes forming interdigital electrodes on the lower surface of the piezoelectric substrate.

4. The method of claim 1 further comprising forming a passive device within the body.

5. The method of claim 1 wherein forming the body includes depositing a first layer of polymeric material on the sacrificial semiconductor wafer, depositing a seal layer on the first layer of polymeric material, and depositing a second layer of polymeric material on the seal layer.

6. The method of claim 5 wherein depositing the seal layer on the first layer of polymeric material includes depositing a layer of dielectric material on the first layer of polymeric material.

7. The method of claim 1 wherein bonding the lower surface of the piezoelectric substrate directly to the upper ends of the conductive vias and to the seal ring includes forming a bonding structure including a metal standoff layer on the lower surface of the piezoelectric substrate and bonding the lower surface of the piezoelectric substrate directly to the upper ends of the conductive vias and to the seal ring with the bonding structure.

8. The method of claim 1 further comprising forming one or more polymer standoffs within the cavity.

9. The method of claim 1 further comprising depositing a seal layer on an upper surface of the body, the seal layer defining a lower wall of the cavity.

10. The method of claim 9 wherein depositing the seal layer includes depositing a layer of dielectric material on the upper surface of the body.

11. The method of claim 1 further comprising depositing a layer of nitride on a lower end and side surfaces of the seal ring.

12. The method of claim 1 further comprising depositing a layer of nitride on side portions of the contact bumps.

13. The method of claim 1 further comprising incorporating a metal roof into the body below the cavity.

14. The method of claim 1 further comprising forming a metal layer in an upper portion of the body below the cavity, the metal layer defining a lower wall of the cavity.

15. The method of claim 14 further comprising forming metal standoffs between the metal layer and the piezoelectric substrate.

16. The method of claim 1 further comprising forming a metal layer in an upper portion of the body below the cavity and forming a layer of dielectric material on an upper surface of the metal layer, the dielectric material formed on the metal layer defining a lower wall of the cavity.

17. The method of claim 1 further comprising mounting the wafer-level chip-scale package in an electronic device module.

18. The method of claim 17 further comprising mounting the electronic device module in an electronic device.

19. A method of forming an electronic device module, the method comprising:

forming a wafer-level chip-scale package, the wafer-level chip-scale package including a device disposed on a piezoelectric substrate, forming the wafer-level chip-scale package including:

forming a body of the package on a sacrificial semiconductor wafer;

forming conductive vias passing through the body;

forming contact bumps in electrical connection with lower ends of the conductive vias at lower portions of the body;

forming a metal seal ring within the body;

removing the sacrificial semiconductor wafer from the body;

forming a cavity within the body;

bonding a lower surface of the piezoelectric substrate directly to upper ends of the conductive vias and to the seal ring such that the piezoelectric substrate defines an upper wall of the cavity and the device is positioned within the cavity; and mounting the wafer-level chip-scale package in the electronic device module.

20. A method of forming an electronic device, the method comprising forming an electronic device module including a wafer-level chip-scale package, the wafer-level chip-scale package including a device disposed on a piezoelectric substrate, forming the wafer-level chip-scale package including:

forming a body of the package on a sacrificial semiconductor wafer;

forming conductive vias passing through the body;

forming contact bumps in electrical connection with lower ends of the conductive vias at lower portions of the body;

forming a metal seal ring within the body;

removing the sacrificial semiconductor wafer from the body;

forming a cavity within the body;

bonding a lower surface of the piezoelectric substrate directly to upper ends of the conductive vias and to the seal ring such that the piezoelectric substrate defines an upper wall of the cavity and the device is positioned within the cavity;

mounting the wafer-level chip-scale package in the electronic device module; and mounting the electronic device module in the electronic device.

* * * * *